US009748434B1

(12) United States Patent
Sung et al.

(10) Patent No.: US 9,748,434 B1
(45) Date of Patent: Aug. 29, 2017

(54) SYSTEMS, METHOD AND APPARATUS FOR CURING CONDUCTIVE PASTE

(71) Applicant: SolarCity Corporation, San Mateo, CA (US)

(72) Inventors: Edward Sung, Milpitas, CA (US); James Zu-Yi Liu, Fremont, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/163,543

(22) Filed: May 24, 2016

(51) Int. Cl.
*H01L 31/18* (2006.01)
*H01L 25/00* (2006.01)
*H01L 31/05* (2014.01)

(52) U.S. Cl.
CPC .......... *H01L 31/1864* (2013.01); *H01L 25/50* (2013.01); *H01L 31/0512* (2013.01)

(58) Field of Classification Search
None
See application file for complete search history.

(56) References Cited

U.S. PATENT DOCUMENTS

| | | |
|---|---|---|
| 3,603,284 A | 9/1971 | Garnache |
| 3,637,434 A | 1/1972 | Nakanuma |
| 3,658,585 A | 4/1972 | Folkmann |
| 3,675,619 A | 7/1972 | Burd |
| 3,699,298 A | 10/1972 | Briody |
| 3,796,182 A | 3/1974 | Rosler |
| 3,806,360 A | 4/1974 | Briody |
| 4,154,998 A | 5/1979 | Luft |
| 4,168,998 A | 9/1979 | Hasegawa |
| 4,193,756 A | 3/1980 | Leon |
| 4,268,374 A | 5/1981 | Lepselter |
| 4,298,443 A | 11/1981 | Maydan |
| 4,325,778 A | 4/1982 | Lepselter |
| 4,355,974 A | 10/1982 | Lee |
| 4,496,828 A | 1/1985 | Kusmierz |
| 4,522,149 A | 6/1985 | Garbis |
| 4,558,660 A | 12/1985 | Nishizawa |
| 4,565,157 A | 1/1986 | Brors |
| 4,579,080 A | 4/1986 | Martin |

(Continued)

FOREIGN PATENT DOCUMENTS

| CN | 101263590 | 9/2008 |
|---|---|---|
| CN | 102559134 | 7/2012 |

(Continued)

OTHER PUBLICATIONS

Beaucarne, G et al., "Epitaxial thin-film Si solar cells", pp. 533-542, Science Direct, www.sciencedirect.com, Thin Solid Films 511-512 (2006) 533-542.

(Continued)

*Primary Examiner* — Asok K Sarkar
(74) *Attorney, Agent, or Firm* — Shun Yao; Park, Vaughan, Fleming & Dowler LLP

(57) ABSTRACT

One embodiment can provide a system for curing conductive paste applied on photovoltaic structures. The system can include a wafer carrier for carrying a plurality of photovoltaic structures and a heater. The wafer carrier can include a surface element that is in direct contact with the photovoltaic structures and is substantially thermally insulating. The heater can be positioned above the wafer carrier. The heater can include a heated radiation surface that does not directly contact the photovoltaic structures.

8 Claims, 16 Drawing Sheets

(56) References Cited

U.S. PATENT DOCUMENTS

| | | |
|---|---|---|
| 4,612,207 A | 9/1986 | Jansen |
| 4,661,199 A | 4/1987 | Looney |
| 4,668,484 A | 5/1987 | Elliott |
| 4,747,367 A | 5/1988 | Posa |
| 4,761,044 A | 8/1988 | Akama |
| 4,761,269 A | 8/1988 | Conger |
| 4,786,352 A | 11/1988 | Benzing |
| 4,794,220 A | 12/1988 | Sekiya |
| 4,807,562 A | 2/1989 | Sandys |
| 4,823,736 A | 4/1989 | Post |
| 4,838,983 A | 6/1989 | Schumaker |
| 4,839,145 A | 6/1989 | Gale |
| 4,858,558 A | 8/1989 | Ohmura |
| 4,867,629 A | 9/1989 | Iwasawa |
| 4,928,626 A | 5/1990 | Carlson |
| 4,967,645 A | 11/1990 | Mattson |
| 4,993,559 A | 2/1991 | Cota |
| 5,038,711 A | 8/1991 | Dan |
| 5,053,247 A | 10/1991 | Moore |
| 5,074,245 A | 12/1991 | Ota |
| 5,119,540 A | 6/1992 | Kong |
| 5,121,531 A | 6/1992 | Severns |
| 5,151,133 A | 9/1992 | Ohmine |
| 5,207,835 A | 5/1993 | Moore |
| 5,269,847 A | 12/1993 | Anderson |
| 5,288,364 A | 2/1994 | Burt |
| 5,350,455 A | 9/1994 | Mahler |
| 5,351,415 A | 10/1994 | Brooks |
| 5,373,806 A | 12/1994 | Logar |
| 5,374,159 A | 12/1994 | Severns |
| 5,427,824 A | 6/1995 | Inushima |
| 5,441,571 A | 8/1995 | Ohta |
| 5,452,795 A | 9/1995 | Gallagher |
| 5,453,124 A | 9/1995 | Moslehi |
| 5,458,918 A | 10/1995 | Hawkins |
| 5,476,359 A | 12/1995 | Severns |
| 5,505,778 A | 4/1996 | Ono |
| 5,518,549 A | 5/1996 | Hellwig |
| 5,532,190 A | 7/1996 | Goodyear |
| 5,614,447 A | 3/1997 | Yamaga |
| 5,629,245 A | 5/1997 | Inushima |
| 5,700,422 A | 12/1997 | Usui |
| 5,785,186 A | 7/1998 | Babbs |
| H1762 H | 12/1998 | Kaempf |
| 5,871,586 A | 2/1999 | Crawley |
| 5,916,369 A | 6/1999 | Anderson |
| 5,935,345 A | 8/1999 | Kuznicki |
| 5,950,925 A | 9/1999 | Fukunaga |
| 5,960,960 A | 10/1999 | Yamamoto |
| 5,964,948 A | 10/1999 | Dietze |
| 5,993,555 A | 11/1999 | Hamilton |
| 5,994,675 A | 11/1999 | Bethune |
| 6,013,338 A | 1/2000 | Inushima |
| 6,077,722 A | 6/2000 | Jansen |
| 6,098,808 A | 8/2000 | Matsuda |
| 6,110,289 A | 8/2000 | Moore |
| 6,113,984 A | 9/2000 | MacLeish |
| 6,120,605 A | 9/2000 | Sato |
| 6,122,566 A | 9/2000 | Nguyen |
| 6,129,048 A | 10/2000 | Sullivan |
| 6,152,680 A | 11/2000 | Howells |
| 6,193,804 B1 | 2/2001 | Chang |
| 6,214,116 B1 | 4/2001 | Shin |
| 6,217,662 B1 | 4/2001 | Kong |
| 6,262,393 B1 | 7/2001 | Imai |
| 6,328,169 B1 | 12/2001 | Matsuda |
| 6,338,756 B2 | 1/2002 | Dietze |
| 6,348,397 B2 | 2/2002 | Ide |
| 6,370,791 B1 | 4/2002 | Weaver |
| 6,399,510 B1 | 6/2002 | Riley |
| 6,435,428 B2 | 8/2002 | Kim |
| 6,472,284 B2 | 10/2002 | Kim |
| 6,472,639 B2 | 10/2002 | Nishitani |
| 6,478,923 B1 | 11/2002 | Igarashi |
| 6,500,734 B2 | 12/2002 | Anderson |
| 6,506,256 B2 | 1/2003 | Ide |
| 6,530,990 B2 | 3/2003 | Kong |
| 6,544,333 B2 | 4/2003 | Keck |
| 6,562,128 B1 | 5/2003 | Dietze |
| 6,637,988 B1 | 10/2003 | Park |
| 6,679,672 B1 | 1/2004 | Barrows |
| 6,716,027 B2 | 4/2004 | Kim |
| 6,747,249 B2 | 6/2004 | Robinson |
| 6,808,352 B2 | 10/2004 | Seita |
| 6,814,811 B2 | 11/2004 | Ose |
| 6,916,399 B1 | 7/2005 | Rozenzon |
| 6,934,145 B2 | 8/2005 | Hsieh |
| 6,948,623 B2 | 9/2005 | Takano |
| 6,959,823 B2 | 11/2005 | Jun |
| 7,153,368 B2 | 12/2006 | Preti |
| 7,159,537 B2 | 1/2007 | Wickramanayaka |
| 7,225,934 B2 | 6/2007 | Shon |
| 7,270,713 B2 | 9/2007 | Blonigan |
| 7,273,526 B2 | 9/2007 | Shinriki |
| 7,293,950 B2 | 11/2007 | Bonora |
| 7,313,452 B2 | 12/2007 | Kobayashi |
| 7,314,526 B1 | 1/2008 | Preti |
| 7,354,622 B2 | 4/2008 | Shinriki |
| 7,357,842 B2 | 4/2008 | Ishikawa |
| 7,410,340 B2 | 8/2008 | Bonora |
| 7,442,562 B2 | 10/2008 | Onishi |
| 7,462,246 B2 | 12/2008 | Hellwig |
| 7,628,863 B2 | 12/2009 | Sen |
| 7,819,261 B2 | 10/2010 | Mayuzumi |
| 7,897,525 B2 | 3/2011 | Lei |
| 7,900,776 B2 | 3/2011 | Burns |
| 7,918,938 B2 | 4/2011 | Provencher |
| 7,988,399 B2 | 8/2011 | vanderMeulen |
| 7,989,729 B1 | 8/2011 | Zhao |
| 8,034,667 B2 | 10/2011 | Shinoda |
| 8,080,107 B2 | 12/2011 | Kennedy |
| 8,110,511 B2 | 2/2012 | Lei |
| 8,133,323 B2 | 3/2012 | Kakegawa |
| 8,173,473 B2 | 5/2012 | Aqui |
| 8,183,132 B2 | 5/2012 | Nijhawan |
| 8,231,799 B2 | 7/2012 | Bera |
| 8,246,284 B2 | 8/2012 | Borden |
| 8,257,547 B2 | 9/2012 | Pei |
| 8,268,078 B2 | 9/2012 | Suzuki |
| 8,268,734 B2 | 9/2012 | Lei |
| 8,288,645 B2 | 10/2012 | Lee |
| 8,367,565 B2 | 2/2013 | Lei |
| 8,388,753 B2 | 3/2013 | Pei |
| 8,404,049 B2 | 3/2013 | Hellwig |
| 8,430,962 B2 | 4/2013 | Masuda |
| 8,435,424 B2 | 5/2013 | Hsu |
| 8,448,598 B2 | 5/2013 | Pei |
| 8,481,844 B2 | 7/2013 | Nishida |
| 8,500,388 B2 | 8/2013 | vanderMeulen |
| 8,528,750 B2 | 9/2013 | Heo |
| 8,539,908 B2 | 9/2013 | Takagi |
| 8,562,745 B2 | 10/2013 | Rozenzon |
| 8,563,998 B2 | 10/2013 | Wegleiter |
| 8,608,854 B2 | 12/2013 | Pei |
| 8,691,620 B2 | 4/2014 | Lee |
| 8,764,902 B2 | 7/2014 | Suzuki |
| 8,778,079 B2 | 7/2014 | Begarney |
| 8,808,454 B2 | 8/2014 | Lee |
| 8,877,000 B2 | 11/2014 | Strang |
| 8,898,930 B2 | 12/2014 | Godot |
| 8,967,081 B2 | 3/2015 | Borean |
| 8,980,005 B2 | 3/2015 | Carlson |
| 9,022,714 B2 | 5/2015 | Lee |
| 9,105,673 B2 | 8/2015 | Babbs |
| 9,117,670 B2 | 8/2015 | Abedijaberi |
| 9,147,788 B2 | 9/2015 | DeGroot |
| 9,159,864 B2 | 10/2015 | Lucas |
| 9,205,505 B2 | 12/2015 | Sridharan |
| 2001/0040100 A1 | 11/2001 | Wang |
| 2002/0004309 A1 | 1/2002 | Collins |
| 2002/0102859 A1 | 8/2002 | Yoo |
| 2003/0012885 A1 | 1/2003 | Gramarossa |
| 2003/0019428 A1 | 1/2003 | Ku |
| 2003/0145791 A1 | 8/2003 | Shinya |

(56) References Cited

U.S. PATENT DOCUMENTS

| | | |
|---|---|---|
| 2004/0135979 A1 | 7/2004 | Hazelton |
| 2005/0016956 A1 | 1/2005 | Liu |
| 2005/0105991 A1 | 5/2005 | Hofmeister |
| 2005/0199279 A1 | 9/2005 | Yoshimine et al. |
| 2005/0208217 A1 | 9/2005 | Shinriki |
| 2005/0226794 A1 | 10/2005 | Hodge |
| 2005/0229848 A1 | 10/2005 | Shinriki |
| 2006/0006559 A1 | 1/2006 | Nakagawa |
| 2006/0016559 A1 | 1/2006 | Kobayashi |
| 2006/0060791 A1 | 3/2006 | Hazelton |
| 2006/0124169 A1 | 6/2006 | Mizusawa |
| 2006/0156970 A1 | 7/2006 | Dong-Suk |
| 2006/0191118 A1 | 8/2006 | Lee |
| 2006/0191637 A1 | 8/2006 | Zajac |
| 2006/0201414 A1 | 9/2006 | Brabant |
| 2006/0231035 A1 | 10/2006 | Hellwig |
| 2007/0011863 A1 | 1/2007 | Yoshikawa |
| 2007/0051314 A1 | 3/2007 | Choi |
| 2007/0131173 A1 | 6/2007 | Halpin |
| 2007/0175391 A1 | 8/2007 | Mizusawa |
| 2007/0181181 A1 | 8/2007 | Mizusawa |
| 2007/0247075 A1 | 10/2007 | Kim |
| 2007/0249173 A1 | 10/2007 | Kim |
| 2007/0251642 A1 | 11/2007 | Bera |
| 2007/0254483 A1 | 11/2007 | Bera |
| 2007/0254486 A1 | 11/2007 | Bera |
| 2008/0000851 A1 | 1/2008 | Pickering |
| 2008/0092944 A1* | 4/2008 | Rubin ............ H01L 31/022425 136/252 |
| 2008/0176289 A1* | 7/2008 | Zeng ........................ B01L 7/52 435/91.2 |
| 2008/0196757 A1 | 8/2008 | Yoshimine |
| 2008/0276451 A1 | 11/2008 | Morad |
| 2009/0014746 A1 | 1/2009 | Ramirez |
| 2009/0067957 A1 | 3/2009 | Ando |
| 2009/0081878 A1 | 3/2009 | Dhindsa |
| 2009/0117746 A1 | 5/2009 | Masuda |
| 2009/0139570 A1 | 6/2009 | Kinoshita |
| 2009/0194235 A1 | 8/2009 | Kobayashi |
| 2009/0311869 A1 | 12/2009 | Okesaku |
| 2010/0009489 A1 | 1/2010 | Tu |
| 2010/0029067 A1 | 2/2010 | Vijh |
| 2010/0047954 A1 | 2/2010 | Su |
| 2010/0092697 A1 | 4/2010 | Poppe |
| 2010/0092698 A1 | 4/2010 | Poppe |
| 2010/0096003 A1 | 4/2010 | Hobbie |
| 2010/0132778 A1 | 6/2010 | Hong |
| 2010/0162954 A1 | 7/2010 | Lei |
| 2010/0167503 A1 | 7/2010 | Lei |
| 2010/0171215 A1 | 7/2010 | Fischer |
| 2010/0173439 A1 | 7/2010 | Lei |
| 2010/0183825 A1 | 7/2010 | Becker |
| 2010/0263587 A1 | 10/2010 | Sivaramakrishnan |
| 2010/0273279 A1 | 10/2010 | Su |
| 2010/0282272 A1 | 11/2010 | Godot |
| 2010/0300506 A1 | 12/2010 | Heng et al. |
| 2010/0313877 A1 | 12/2010 | Bellman |
| 2011/0033638 A1 | 2/2011 | Ponnekanti |
| 2011/0033957 A1 | 2/2011 | Holden |
| 2011/0048325 A1 | 3/2011 | Choi |
| 2011/0067632 A1 | 3/2011 | Poppe |
| 2011/0151119 A1 | 6/2011 | Lei |
| 2011/0177627 A1 | 7/2011 | Huegli |
| 2011/0217469 A1 | 9/2011 | Lei |
| 2011/0245957 A1 | 10/2011 | Porthouse |
| 2011/0262252 A1 | 10/2011 | Lee |
| 2011/0262628 A1 | 10/2011 | Sferlazzo |
| 2011/0263070 A1 | 10/2011 | Schaeffer |
| 2011/0277688 A1 | 11/2011 | Trujillo |
| 2011/0277690 A1 | 11/2011 | Rozenzon |
| 2011/0283941 A1 | 11/2011 | Rozenzon |
| 2011/0285840 A1 | 11/2011 | Benson |
| 2012/0076936 A1 | 3/2012 | Hirano |
| 2012/0111271 A1 | 5/2012 | Begarney |
| 2012/0125391 A1 | 5/2012 | Pinarbasi |
| 2012/0315395 A1 | 12/2012 | Kuribe |
| 2012/0318340 A1 | 12/2012 | Heng |
| 2013/0171757 A1 | 7/2013 | Ponnekanti |
| 2013/0269602 A1 | 10/2013 | Miyamoto |
| 2014/0060633 A1 | 3/2014 | Lucas |
| 2014/0086720 A1 | 3/2014 | Kao |
| 2014/0124013 A1 | 5/2014 | Morad et al. |
| 2014/0124713 A1 | 5/2014 | Majumdar |
| 2014/0287159 A1 | 9/2014 | Carmody |
| 2014/0299256 A1 | 10/2014 | Sridharan |
| 2015/0068587 A1 | 3/2015 | Lomasney |
| 2015/0108107 A1* | 4/2015 | Liu ................ H01L 21/67109 219/396 |
| 2015/0194374 A1* | 7/2015 | Ananiev ........... H01L 23/49575 257/676 |
| 2015/0206780 A1 | 7/2015 | Choi |
| 2015/0303079 A1 | 10/2015 | Oosterlaken |
| 2015/0349703 A1 | 12/2015 | Morad |
| 2015/0364356 A1* | 12/2015 | Moore ................ B32B 17/067 156/247 |
| 2016/0009958 A1 | 1/2016 | Moore |

FOREIGN PATENT DOCUMENTS

| | | |
|---|---|---|
| CN | 102800746 | 11/2012 |
| CN | 103943727 | 7/2014 |
| CN | 104040732 | 9/2014 |
| CN | 103000253 | 5/2015 |
| CN | 104600158 | 5/2015 |
| CN | 105761778 | 7/2016 |
| DE | 3833703 | 5/1992 |
| EP | 2098609 | 9/2009 |
| EP | 2489759 | 8/2012 |
| JP | 11163089 | 6/1999 |
| JP | H11288890 A | 10/1999 |
| JP | 2002179207 | 6/2002 |
| JP | 2003158054 A | 5/2003 |
| JP | 2003277936 A | 10/2003 |
| JP | 2006080098 A | 3/2006 |
| JP | 2013149596 | 8/2013 |
| JP | 2014197592 | 10/2014 |
| KR | 20060117134 A | 11/2006 |
| KR | 1404986 | 6/2014 |
| KR | 101404986 | 6/2014 |
| KR | 20150137810 | 12/2015 |
| WO | 0072362 | 11/2000 |
| WO | 2009029901 | 3/2009 |
| WO | 2009090172 | 7/2009 |
| WO | 2010129136 A2 | 11/2010 |
| WO | 2010129136 A3 | 11/2010 |
| WO | 2011133965 | 10/2011 |
| WO | 2012128459 | 9/2012 |
| WO | 2012174432 | 12/2012 |
| WO | 2013124394 | 8/2013 |
| WO | 2014045241 | 3/2014 |
| WO | 2014046810 | 3/2014 |
| WO | 2015163163 | 10/2015 |

OTHER PUBLICATIONS

Cebrian et al., "Paste Adhesive Modification for Induction Curing", Jan. 2012.

"Pad printing as a film forming technique for polymer solar cells" Krebs, F.C.

"Thick-Film Materials for Silicon Photovoltaic Cell Manufacture" Field, M.B. Jan. 1997.

* cited by examiner

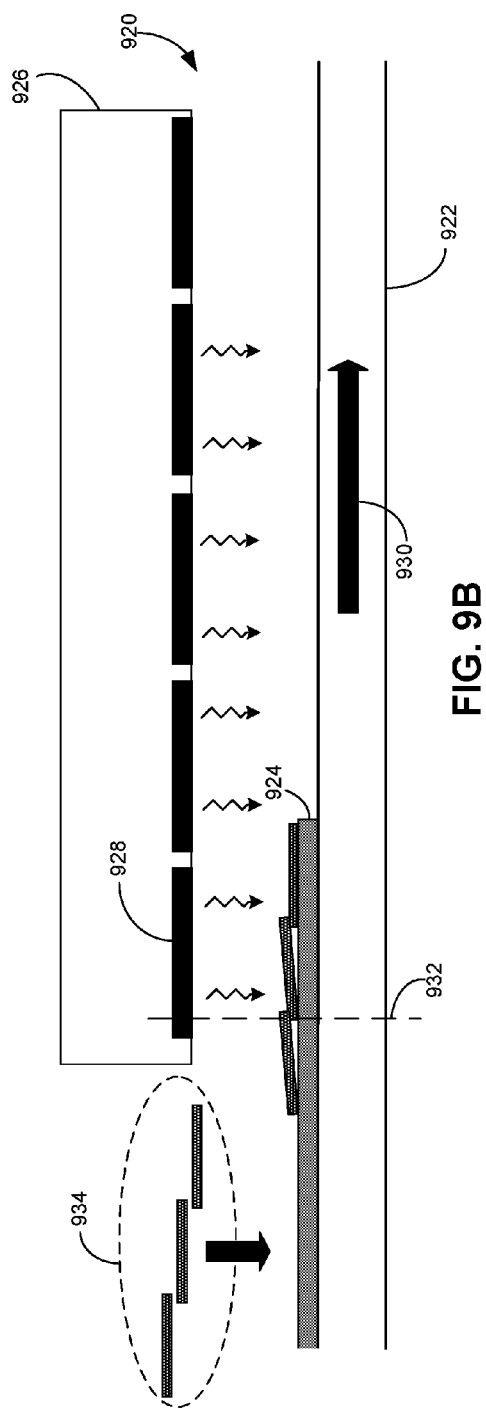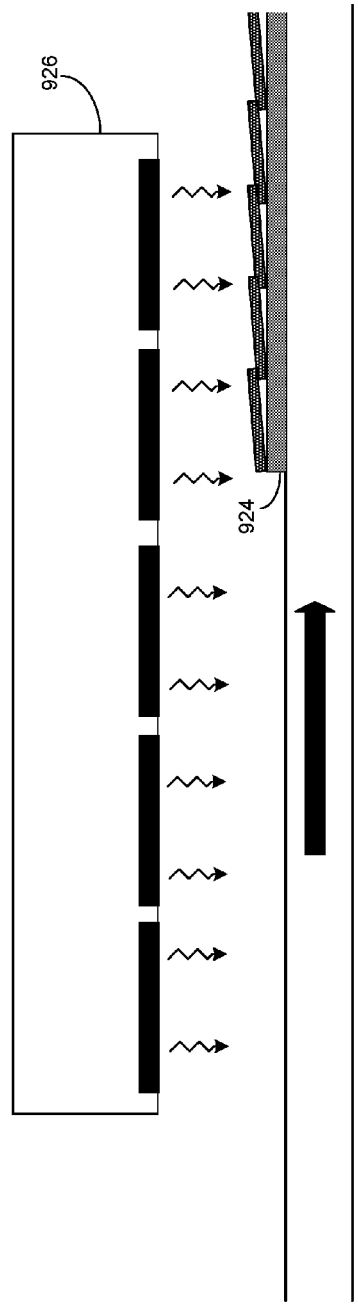
FIG. 9B
FIG. 9C

SYSTEMS, METHOD AND APPARATUS FOR CURING CONDUCTIVE PASTE

FIELD OF THE INVENTION

This generally relates to the fabrication of photovoltaic structures. More specifically, this disclosure is related to a system and method for curing conductive paste that is used for electrical and mechanical coupling between cascaded strips.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of strips may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which is used to make solar panels, have helped solar energy gain mass appeal among those wishing to reduce their carbon footprint and decrease their monthly energy costs. However, the panels are typically fabricated manually, which is a time-consuming and error-prone process. This makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014, and entitled "Module Fabrication of Solar Cells with Low Resistivity Electrodes," the disclosure of which is incorporated herein by reference in its entirety. Producing solar panels with a cascaded cell arrangement can reduce the resistance due to interconnections between the strips, and can increase the number of solar cells that can fit into a solar panel.

Fabrications of such cascaded panels can involve overlapping edges of adjacent cells in such a way that the electrodes (busbars) on opposite sides of the overlapped cells are in contact to establish an electrical connection. This process is repeated for a number of successive cells until one string of cascaded cells is created. A number of strings are then coupled to each other (either in series or in parallel) and placed in a protective frame. To further reduce internal resistance of the entire panel and to ensure that the manufactured panel is compatible with conventional panels, one form of the cascaded panel (as described in the aforementioned patent application) can include a series of solar cell strips created by dividing complete solar cells into smaller pieces (i.e., the strips). These smaller strips can then be cascaded (edge-overlapped) to form a string. Conductive paste can be applied on the busbars to provide mechanical bonding and electrical coupling between the overlapping busbars of adjacent strips.

SUMMARY

A system for curing conductive paste applied on photovoltaic structures can be provided. The system can include a wafer carrier and a heater. The wafer carrier can carry a plurality of photovoltaic structures and can include a surface element that is in direct contact with the photovoltaic structures. The surface element can be substantially thermally insulating. The heater can be positioned above the wafer carrier, and can include a heated radiation surface that does not directly contact the photovoltaic structures.

In some embodiments, the surface element can be made of polybenzimidazole (PBI) plastic.

In further embodiments, a surface of the surface element can be patterned such that only a fraction of the surface is in contact with the photovoltaic structures.

In some embodiments, the surface element can include a number of components separated by air gaps to allow an individual component to expand when heated.

In some embodiments, the temperature of the heated radiation surface can be kept between 200 and 600° C.

In some embodiments, the heater can include a radiation block, and the radiation surface of the radiation block can be coated with a substantially dark colored coating.

In further embodiments, the substantially dark colored coating can include an anodizing coating or a high-emissivity coating, and the thickness of the dark colored coating can be between 1 and 100 microns.

In further embodiments, other surfaces of the radiation block are polished or covered with a layer of thermal insulation material.

In some embodiments, the radiation block can be made of a material having thermal conductivity of at least 50 W/(m·k).

In some embodiments, the wafer carrier can further include a base for coupling the wafer carrier to a conveyor system.

BRIEF DESCRIPTION OF THE FIGURES

FIG. 9B shows an exemplary inline thermal curing system, according to an embodiment of the present invention.

FIG. 9C shows the end of a wafer carrier moving out of the heated region below the heater, according to an embodiment of the present invention.

In the figures, like reference numerals refer to the same figure elements.

DETAILED DESCRIPTION

Figure 1A:
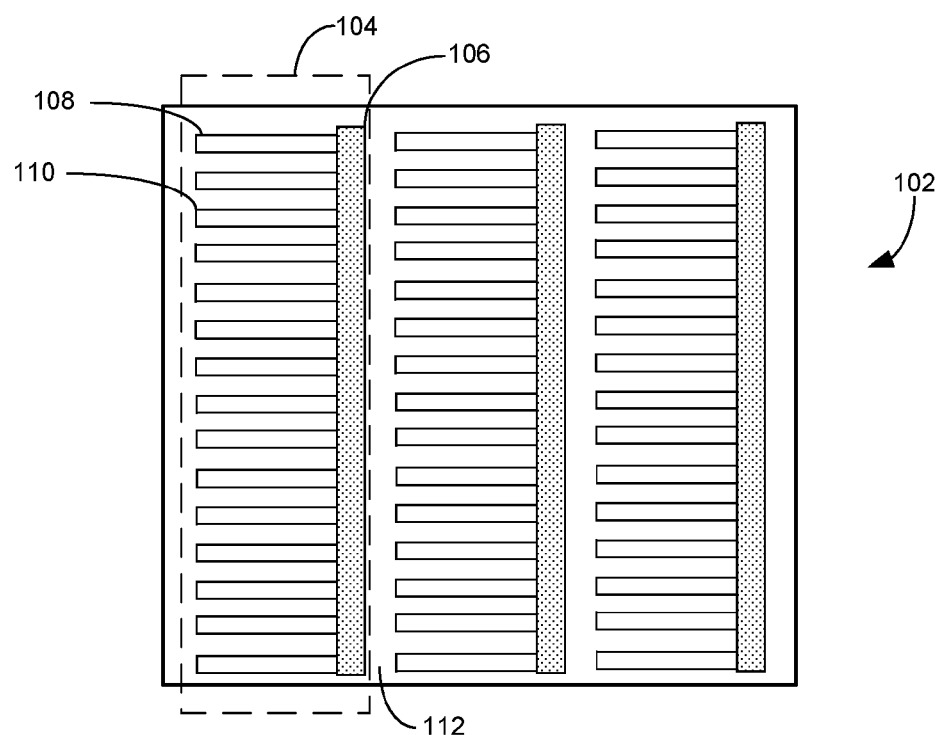
FIG. 1A shows an exemplary grid pattern on the front surface of a photovoltaic structure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can provide a system and apparatus for thermally curing conductive paste used for edge-overlapped bonding solar cell strips. More specifically, the system includes a heater and a wafer carrier. The heater can include a metallic block, which can radiate heat to the surface of solar strips, causing the conductive paste sandwiched between overlapping busbars to be cured. The radiation surface of the metallic block can be coated, anodized, or roughened to have a substantially dark color, thus increasing the radiation efficiency. The wafer carrier can be made of materials that are resistant to high temperatures and have a low thermal conductive coefficient. In some embodiments, at least a portion of the wafer carrier can be made of polybenzimidazole (PBI) plastic. The very low thermal conductivity of the PBI plastic can ensure that the heat emitted from the heater is mostly trapped between the heater and the substrate carrier and, thus, can efficiently cure the conductive paste.

Solar Panel Based on Cascaded Strips

As described in U.S. patent application Ser. No. 14/563,867, a solar panel can have multiple (e.g., three) strings, each string including cascaded strips, connected in parallel. Such a multiple-parallel-string panel configuration provides the same output voltage with a reduced internal resistance. In general, a cell can be divided into $n_1$ strips, and a panel can contain $n_2$ strings. The numbers $n_1$ and $n_2$ can be the same or different. The number of strips in a string can be a few more than, a few less than, or the same as the number of regular photovoltaic structures in a conventional single-string panel. Such a configuration can ensure that each string outputs approximately the same voltage as a conventional panel. The $n_2$ strings can then be connected in parallel to form a panel. As a result, the panel's voltage output can be the same as that of the conventional single-string panel, while the panel's total internal resistance can be $1/n_2$ of the resistance of a string. Therefore, in general, a greater $n_2$ can lead to a lower total internal resistance and, hence, more power extracted from the panel. However, a tradeoff is that as $n_2$ increases, the number of connections required to interconnect the strings also increases, which increases the amount of contact resistance. Also, the greater $n_1$ is, the more strips a single cell needs to be divided into, which increases the associated production cost and decreases overall reliability due to the larger number of strips used in a single panel.

Another consideration in determining $n_1$ is the contact resistance between the electrode and the photovoltaic structure on which the electrode is formed. The type of electrode can dictate the number of strips. For example, conventional silver-paste or aluminum-based electrodes typically cannot produce an ideal resistance between the electrode and underlying photovoltaic structure. As a result, such electrodes may require $n_1$ to be smaller, rather than larger. This is because, as $n_1$ increases, the number of inter-strip connections also increases, which leads to increased internal series resistance of each string, and therefore an overall increased internal resistance of the entire panel. In addition, the greater $n_1$ is, the more difficult the fabrication process is. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller $n_1$ can be used to attain the benefit of reduced contact resistance per strip without incurring too much resistance caused by inter-strip connections. In some embodiments, $n_1$ can be selected to be three, which is less than the $n_1$ value generally needed for cells with silver-paste electrodes or other types of electrodes. Correspondingly, two grooves can be scribed on a single cell to allow the cell to be divided into three strips.

In addition to lower contact resistance, electroplated copper electrodes can also offer better tolerance to microcracks, which may occur during a cleaving process. Such microcracks might adversely impact silver-paste-electrode cells. Plated-copper electrodes, on the other hand, can preserve the conductivity across the cell surface even if there are microcracks in the photovoltaic structure. The copper electrode's higher tolerance for microcracks can allow one to use thinner silicon wafers to manufacture cells. As a result, the grooves to be scribed on a cell can be shallower than the grooves scribed on a thicker wafer, which in turn can help increase the throughput of the scribing process. More details on using copper plating to form low-resistance electrodes on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure. In the example shown in FIG. 1A, grid 102 can include three sub-grids, such as sub-grid 104. This three sub-grid configuration can allow the photovoltaic structure to be divided into three strips. To enable cascading, each sub-grid can have an edge busbar, which can be located either at or near the edge. In the example shown in FIG. 1A, each sub-grid can include an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. To facilitate the subsequent laser-assisted scribe-and-cleave process, a predefined blank space (i.e., space not covered by electrodes) can be inserted between the adjacent sub-grids. For example, blank space 112 can be defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
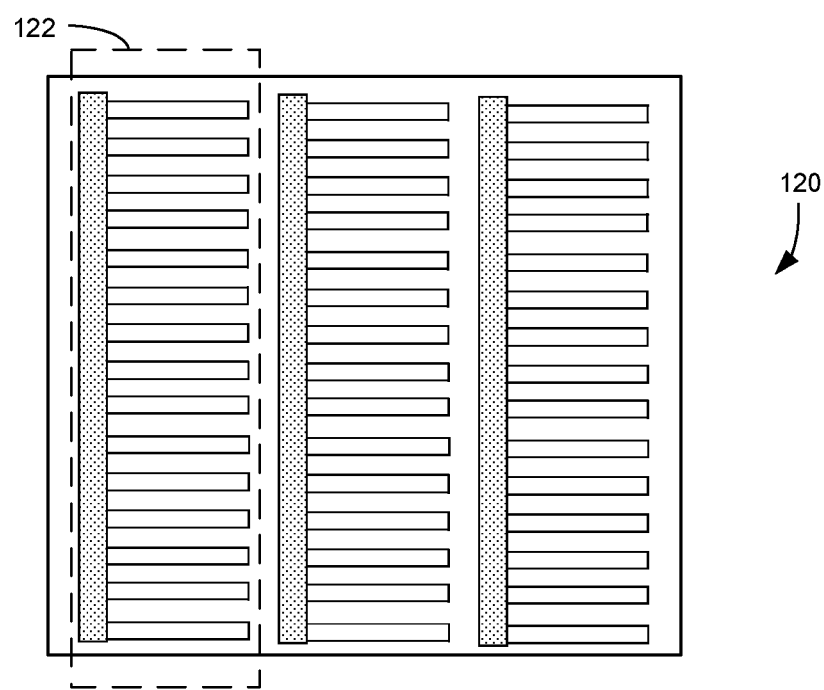
FIG. 1B shows an exemplary grid pattern on the back surface of a photovoltaic structure.

FIG. 1B shows an exemplary grid pattern on the back surface of a photovoltaic structure. When showing the back surface, for illustration purposes, the photovoltaic structure is assumed to be transparent. The grid patterns on the front and back surfaces of the photovoltaic structure are viewed from the same viewing point. In the example shown in FIG. 1B, back grid 120 can include three sub-grids, such as sub-grid 122. To enable cascaded and bifacial operation, the back sub-grid may correspond to the front sub-grid. More specifically, the back edge busbar can be located at the opposite edge of the frontside edge busbar. In the examples shown in FIGS. 1A and 1B, the front and back sub-grids can have similar patterns except that the front and back edge busbars are located adjacent to opposite edges of the strip. In addition, locations of the blank spaces in back conductive grid 120 can correspond to locations of the blank spaces in front conductive grid 102, such that the grid lines do not interfere with the subsequent scribe-and-cleave process. In practice, the finger line patterns on the front and back sides of the photovoltaic structure may be the same or different.

In the examples shown in FIGS. 1A and 1B, the finger line patterns can include continuous, non-broken loops. For example, as shown in FIG. 1A, finger lines 108 and 110 can both include connected loops. This type of "looped" finger line pattern can reduce the likelihood of the finger lines peeling away from the photovoltaic structure after long use. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
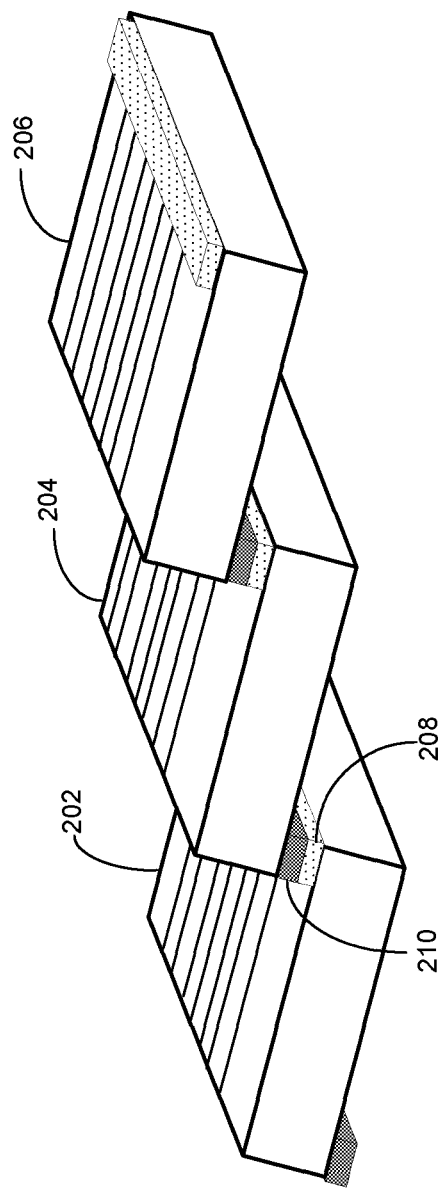
FIG. 2A shows a string of cascaded strips.

To form a cascaded string, cells or strips (e.g., as a result of a scribing-and-cleaving process applied to a regular square cell) can be cascaded with their edges overlapped. FIG. 2A shows a string of cascaded strips. In FIG. 2A, strips 202, 204, and 206 can be stacked in such a way that strip 206 can partially overlap adjacent strip 204, which can also partially overlap (on an opposite edge) strip 202. Such a string of strips can form a pattern that is similar to roof shingles. Each strip can include top and bottom edge busbars located at opposite edges of the top and bottom surfaces, respectively. Strips 202 and 204 may be coupled to each other via an edge busbar 208 located at the top surface of strip 202 and an edge busbar 210 located at the bottom surface of strip 204. To establish electrical coupling, strips 202 and 204 can be placed in such a way that bottom edge busbar 210 is placed on top of and in direct contact with top edge busbar 208.

Figure 2B:
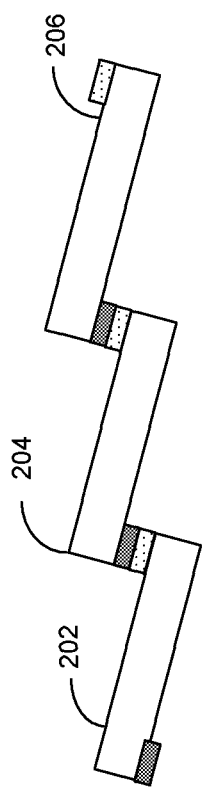
FIG. 2B shows a side view of the string of cascaded strips.

FIG. 2B shows a side view of the string of cascaded strips. In the example shown in FIGS. 2A and 2B, the strips can be part of a 6-inch square photovoltaic structure, with each strip having a dimension of approximately 2 inches by 6 inches. To reduce shading, the overlapping between adjacent strips should be kept as small as possible. In some embodiments, the single busbars (both at the top and the bottom surfaces) can be placed at the very edge of the strip (as shown in FIGS. 2A and 2B). The same cascaded pattern can extend along an entire row of strips to form a serially connected string.

Conductive Paste Curing System

When forming a solar panel, adjacent strips may be bonded together via edge busbars. Such bonding can be important to ensure that the electrical connections have high electrical conductivity and do not fail mechanically when the solar panel is put into service. One option for bonding the metallic busbars can include soldering. For example, the surface of the edge busbars may be coated with a thin layer of Sn. During a subsequent lamination process, heat and pressure can be applied to cure sealant material between photovoltaic structures and the front and back covers of the solar panel. The same heat and pressure can also solder together the edge busbars that are in contact, such as edge busbars 208 and 210. However, the rigid bonding between the soldered contacts may lead to cracking of the thin strips. Moreover, when in service solar panels often experience many temperature cycles, and the thermal mismatch between the metal and the semiconductor may create structural stress that can lead to fracturing.

To reduce the thermal or mechanical stress, it can be preferable to use a bonding mechanism that is sufficiently flexible and can withstand many temperature cycles. One way to do so is to bond the strips using flexible adhesive that is electrically conductive. For example, adhesive (or paste) can be applied on the surface of top edge busbar 208 of strip 202 (shown in FIG. 2A). When strip 204 is placed to partially overlap with strip 202, bottom edge busbar 210 can be bonded to top edge busbar 208 by the adhesive, which can be cured at an elevated temperature. Different types of conductive adhesive or paste can be used to bond the busbars. In one embodiment, the conductive paste can include a conductive metallic core surrounded by a resin. When the paste is applied to a busbar, the metallic core establishes an electrical connection with the busbar while the resin that surrounds the metallic core functions as an adhesive. In another embodiment, the conductive adhesive may be in the form of a resin that includes a number of suspended conductive particles, such as Ag or Cu particles. The conductive particles may be coated with a protective layer. When the paste is thermally cured, the protective layer can evaporate to enable electrical conductivity between the conductive particles suspended inside the resin.

Figure 3A:
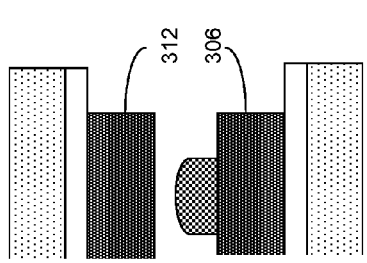
FIGS. 3A and 3B show the busbars and conductive paste before and after, respectively, the conductive paste is cured, according to an embodiment of the present invention.
Figure 3A:
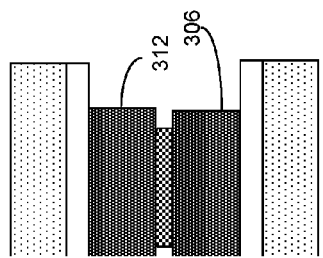
Figure 3A:
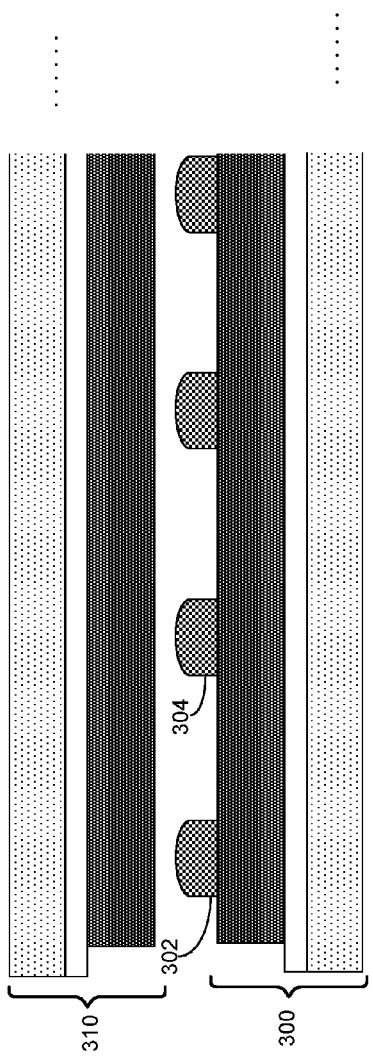
Figure 3B:
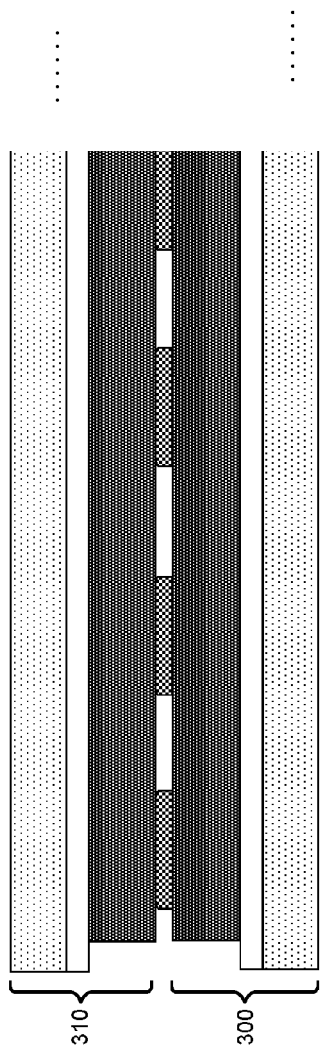

In some embodiments, the overlapping busbars can have the shape of a rectangular prism, and the conductive paste can applied to the surface of at least one of the busbars. Once the conductive paste is cured under heat, the two overlapping busbars will be bonded to each other. FIGS. 3A and 3B show the busbars and conductive paste before and after, respectively, the conductive paste is cured, according to an embodiment of the present invention. More specifically, FIG. 3A shows that droplets of conductive paste (e.g., droplets 302 and 304) can be deposited on busbar 306, which is part of photovoltaic structure 300. FIG. 3B shows that photovoltaic structures 300 and 310 can be bonded to each other when busbar 312 overlaps with busbar 306 and the conductive paste droplets are cured.

Figure 4A:
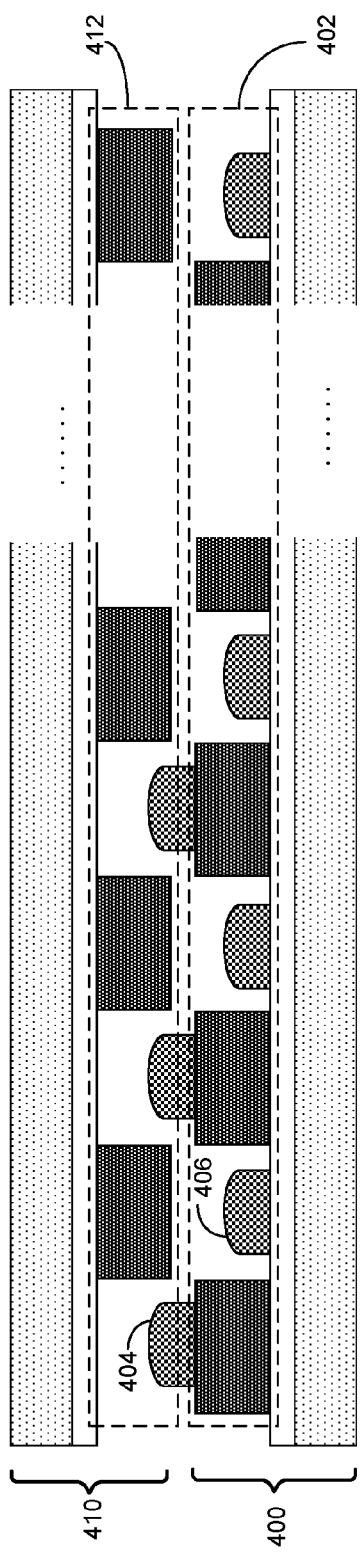
FIGS. 4A and 4B show the busbars and conductive paste before and after, respectively, the conductive paste is cured, according to an embodiment of the present invention.
Figure 4B:
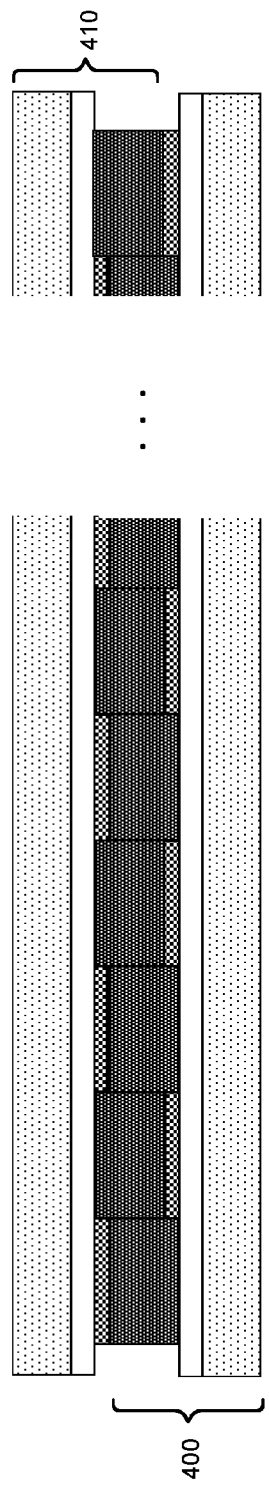

In some embodiments, the overlapping busbars can have complementary overlapping profiles and can interlock when stacked. FIGS. 4A and 4B show the busbars and conductive paste before and after, respectively, the conductive paste is cured, according to an embodiment of the present invention. FIG. 4A shows that segmented busbars 402 and 412 belonging to photovoltaic structure 400 and 410, respectively, have complementary topology profiles. Conductive paste droplets (e.g., droplets 404 and 406) can be applied on segments of busbar 402 and exposed surface of photovoltaic structure 400. FIG. 4B shows that photovoltaic structures 400 and 410 can be bonded to each other when busbars 402 and 412 interlock and the conductive paste droplets are cured. More specifically, segments of the busbar of one photovoltaic structure can be bonded via the cured paste to the exposed surface of the other photovoltaic structure.

Heat can be used to cure the conductive paste. In conventional approaches, cascaded strips (with paste applied and busbars overlapped) can be placed in a convection oven. However, the heating efficiency of such approaches is typically low, because most of the heat may escape to the environment. For example, when the strips are placed inside a convection oven, a majority of the heat is used to heat up the air in the oven. In addition, air must be circulated to ensure that there is effective and even convection occurring on the strips. An uneven airflow can result in temperature non-uniformity on the strips. High airflows can cause the strips to shift position, resulting in incorrect string geometry. On the other hand, although low airflows do not shift the strips, they can lead to low heating efficiency, which not only wastes energy but can also lead to extended heating time. The longer heating time can reduce the throughput of the entire fabrication system. Moreover, long-time exposure of the photovoltaic structures to high temperatures can also damage the photovoltaic structures.

In another conventional approach, cascaded strips can be placed one by one, or in groups, on a heating surface. While the strips are being placed on the surface, the surface must remain cooler than the temperature required for curing the paste; otherwise, the paste may cure prematurely, before all of the strips have been placed onto the surface. To circumvent this, one may keep the surface relatively cool, and only heat it up after all of the strips have been placed. Because these heating surfaces usually have large thermal masses, heating up and cooling down can take a long time, thus reducing the throughput of the fabrication system. In addition, heating and cooling of a large thermal mass can consume a large amount of energy, and can cause large thermal stresses to be applied to the tool.

Figure 5:
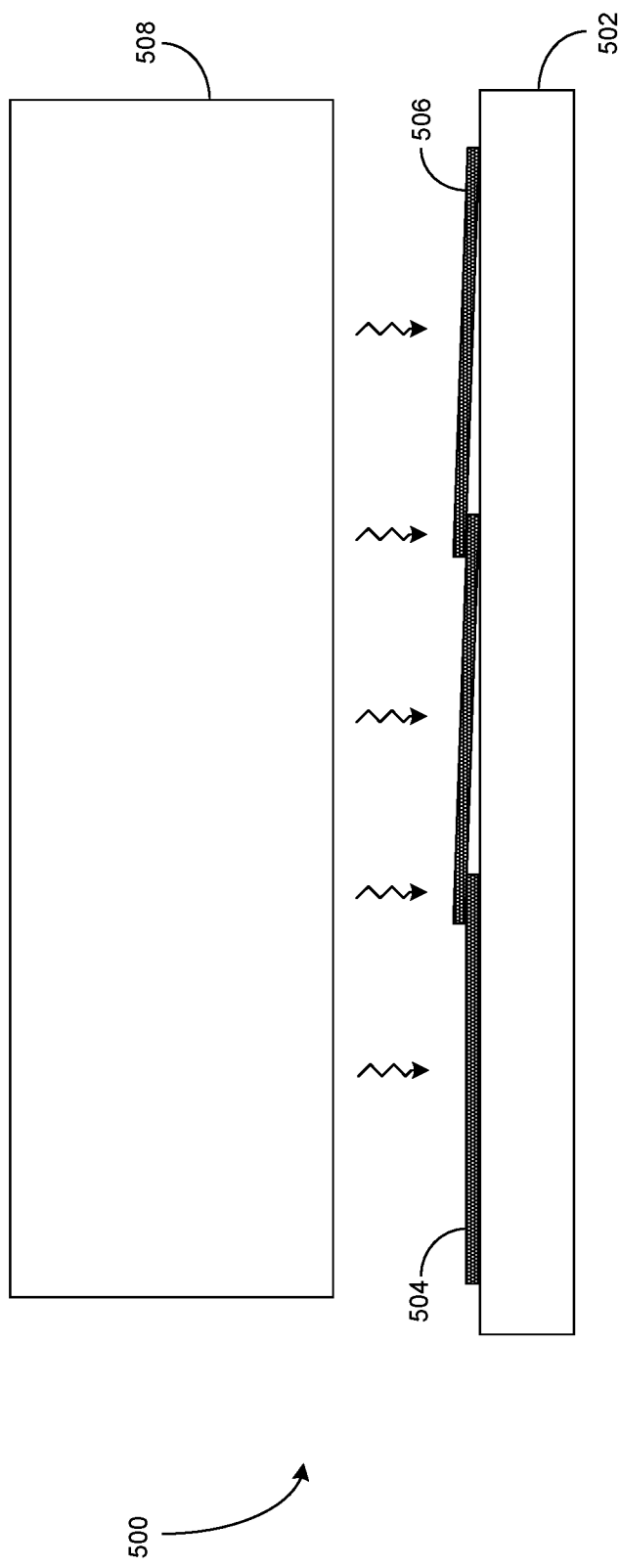
FIG. 5 shows an exemplary thermal curing system, according to an embodiment of the present invention.

To reduce the time needed for curing the conductive paste and to reduce energy usage, a system that can effectively localize the heat to cure the conductive paste can be provided. FIG. 5 shows an exemplary thermal curing system, according to an embodiment of the present invention. Thermal curing system 500 can include a wafer carrier 502 for carrying solar cell strips (e.g., strips 504 and 506) and a heater 508.

In some embodiments, heater 508 can be placed near the surface of the strips with its radiation surface facing the strips. More specifically, heater 508 does not have direct physical contact with the solar cell strips. The radiation surface of heater 508 can emit heat (as indicated by the zigzagged arrows), which can be transferred to and absorbed by the strips and, hence, indirectly heat up the conductive paste sandwiched between the edge-overlapped strips. After being heated for a certain time period, the conductive paste can be cured, mechanically bonding the edge-overlapped strips to each other. All three modes of heat transfer, including conduction, convection, and radiation, can play a role in transferring the heat from heater 508 to the strips, and then to the conductive paste. Among them, radiation plays the most important role, i.e., a majority of the heat can be transferred via radiation. Convection is limited to natural convection, and conduction is limited to the conduction through the air gap between heater 508 and the surface of the strips. Compared with direct-contact-based heating, this heating arrangement can provide higher throughput, improve efficiency, and prevent damage to the strips. Compared with convection-oven-based heating, this heating arrangement can provide better heating uniformity and higher throughput, and can significantly improve efficiency.

Figure 6:
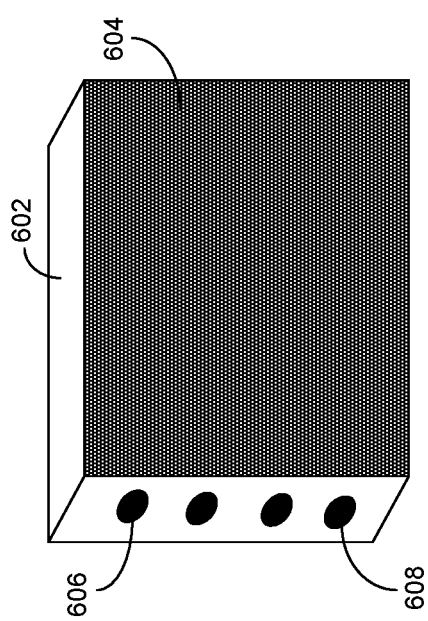
FIG. 6 shows the perspective view of the heater, according to an embodiment of the present invention.

FIG. 6 shows the perspective view of the heater, according to an embodiment of the present invention. Heater 600 can include radiation block 602 and a number of cartridge heaters (not shown in the drawing). Radiation block 602 can be made of a material with high thermal conductivity, including metallic materials (e.g., aluminum and copper) and ceramic materials (e.g., silicon carbide). In some embodiments, the thermal conductivity of the material forming radiation block 602 can be equal to or greater than 50 W/(m·k). Materials with relatively low thermal conductivity, such as stainless steel and alumina, may also be used, as long as the thermal design of the heater can compensate for the low thermal conductivity. In the example shown in FIG. 6, radiation block 602 is shaped as a rectangular prism. Other shapes can also be possible, such as cubical or cylindrical. Radiation block 602 can include a number of voids, extending from one side of radiation block 602 to the other. In some embodiments, cartridge heaters, which are a type of heater and can be shaped like rods, can be inserted into the voids of radiation block 602 to heat radiation block 602 to a high temperature. These cartridge heaters can be coupled to an external power source. The amount of heat provided by these cartridge heaters can be controlled via one or more temperature sensors (not shown in FIG. 6). For example, the system can be configured to maintain the temperature of radiation block at a predetermined value. In some embodiments, the temperature of radiation block 602 can be kept at a value between 200 and 600° C., preferably between 250 and 350° C.

In the view shown in FIG. 6, front surface 604 of radiation block 602 is the surface facing the strips and can radiate heat to the strips. Although the entire body of radiation block 602 is heated and all surfaces of radiation block 602 can radiate heat to the environment, only heat radiated out of surface 604 can be useful for curing the conductive paste on the photovoltaic structure. To increase the amount of heat radiated out of surface 604, in some embodiments, surface 604 can be anodized to have a darker (almost black) color to increase its emissivity. On the other hand, to reduce the amount of heat radiated from other surfaces, all other surfaces are polished to be mirror-like to reduce their emissivity. Alternatively, all other surfaces can be covered or coated with a layer of thermal insulation material to reduce their emissivity. In general, radiation block 602 can be configured in such a way that only one surface has high emissivity and all other surfaces are effectively insulated.

In addition to anodizing, other methods can also be used to increase the emissivity of surface 604. For example, surface 604 can be roughened. Alternatively, surface 604 can be coated with a thin layer of radiation-absorbent material (RAM) coating. For example, an aluminum radiation block can have its radiation surface coated with a layer of Tufram® (registered trademark of General Magnaplate Corporation of Linden, N.J.) coating. The thickness of the coating can be between 1 and 100 microns. In alternative embodiments, a high-emissivity coating, which can be a silicone-ceramic based, black pigmented coating, can be used to coat radiation surface 604. The high-emissivity coating can have a thickness between 1 and 100 microns.

In conventional high-temperature settings, metallic or graphite wafer carriers are often used to support wafers due to their heat-resistant capability. However, although they are not easily damaged by heat, they are also good heat conductors. After being transferred from the radiation block to the strips located on the wafer carriers, a portion of the heat can escape via the wafer carrier due to its good heat conductivity. This can reduce the heating efficiency and, hence, can prolong the time needed for curing the paste. To overcome this problem, instead of metal or graphite, the wafer carrier can be made of a plastic or ceramic material that is heat-resistant and has low thermal conductivity.

Figure 7A:
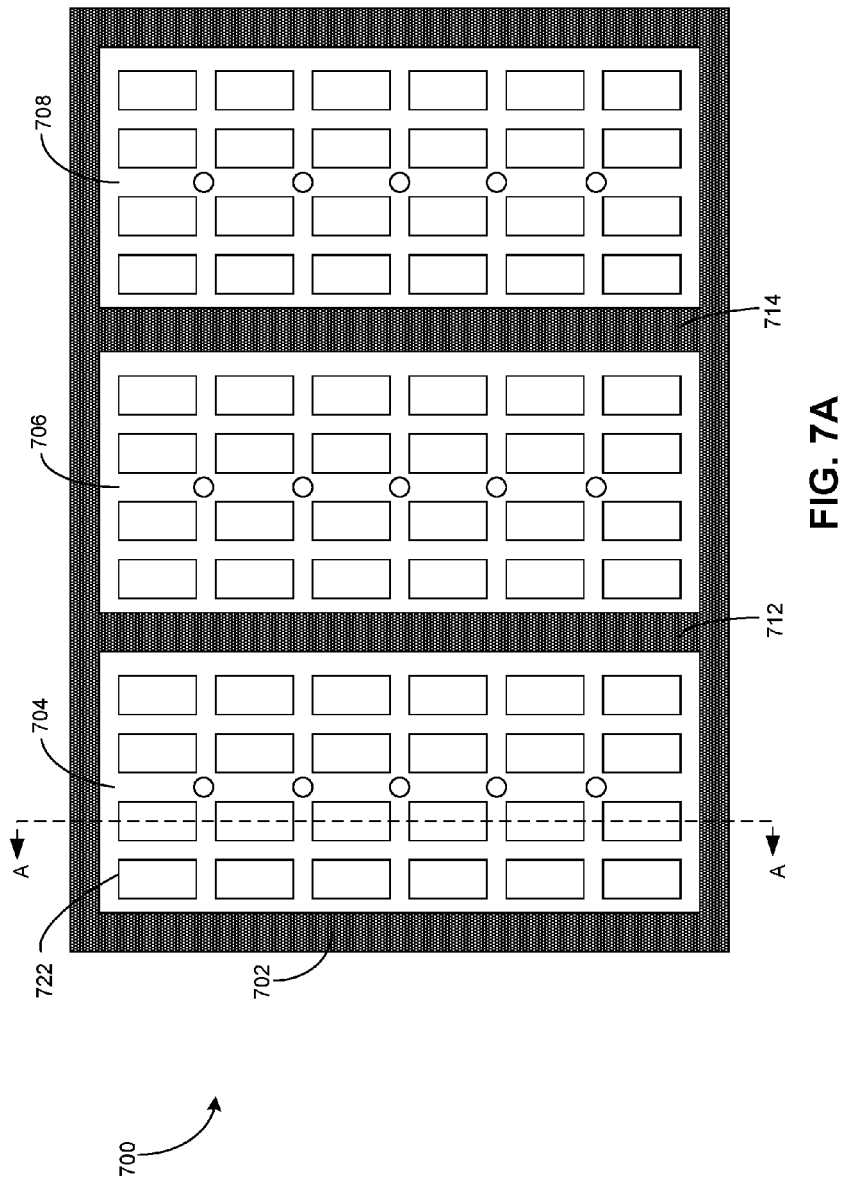
FIG. 7A shows the top view of an exemplary wafer carrier, according to an embodiment of the present invention.

FIG. 7A shows the top view of an exemplary wafer carrier, according to an embodiment of the present invention. Wafer carrier 700 can include a base 702 and a number of strip carriers, such as strip carriers 704, 706, and 708. Base 702 is not in contact with the photovoltaic structures and can be made of materials with good thermal conductivity, such as metal. In one embodiment, base 702 can be made of stainless steel. The base of wafer carrier 700 can be used to couple wafer carrier 700 to a conveyor system, which can transport the photovoltaic structures from one processing station to the next.

The strip carriers can be configured to carry the strips that are precisely aligned such that the busbars of adjacent strips overlap with conductive paste sandwiched in between. A robotic system with the assistance of a vision system can be used to place and align the strips. A detailed description of the robotic system and the vision system can be found in U.S. patent application Ser. No. 14/866,766, entitled "SYSTEMS AND METHODS FOR CASCADING PHOTO-VOLTAIC STRUCTURES," filed Sep. 25, 2015, the disclosure of which is incorporated herein by reference in its entirety.

Because the strip carriers are in direct contact with the heated strips, to reduce heat loss, the strip carriers can be made of a plastic material that is heat-resistant and has low thermal conductivity. In some embodiments, the strip carriers can be made of polybenzimidazole (PBI) plastic. Compared with other plastic materials, PBI plastic can provide a number of superior thermal properties, including high thermal resistance, very low heat conductivity, and very low thermal expansion coefficient. In addition, PBI plastic can also provide superior mechanical properties over other insulating materials, making it an ideal candidate for forming the strip carriers.

Figure 7B:
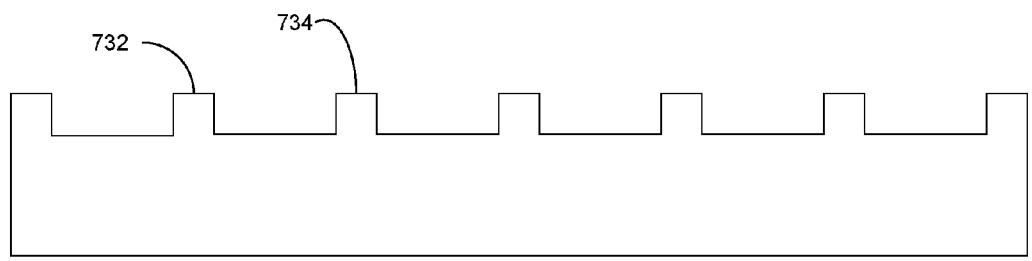
FIG. 7B shows the cross-sectional view of a strip carrier along cut plane A-A, according to an embodiment of the present invention.

In addition to choosing a material with low thermal conductivity to form the strip carriers, in some embodiments, the geometry of the strip carries is also carefully designed to further reduce the heat loss. In the example shown in FIG. 7A, the surface of the strip carriers can be patterned. More specifically, each rectangle (e.g., rectangle 722) on a strip carrier indicates a raised boss. FIG. 7B shows the cross-sectional view of a strip carrier along cut plane A-A, according to an embodiment of the present invention. When a strip is placed on the strip carrier, only the ridges (e.g., ridges 732 and 734) are in contact with the strip. This way, instead of having the entire back surface of the strips in contact with the strip carriers, only a portion of the back surface of the strips is in contact with the strip carrier. In some embodiments, the total size of the top surface of the ridges can be between 10 and 30% the size of a strip carrier. The reduced contact area can reduce the amount of heat being transferred from the strips to the strip carriers. In addition to the pattern shown in FIG. 7A, other patterns are also possible. For example, instead of rectangular, shapes of the indentations can include square, triangular, circular, half circular, oval, or any other regular or irregular shapes.

In some embodiments, the strip carriers can be designed in such a way that each strip carrier can support and carry a single strip. For example, strip carrier 704 can support one strip, and strip carrier 706 can support an adjacent strip. The size of the strip carriers can be defined based on the size of the strip. More specifically, each strip carrier can be designed to be smaller than the strip to allow a gap to exist between two adjacent strip carriers. For strips that were obtained by dividing standard six-inch square wafers, the length of the strip can be roughly six inches, whereas the width of each strip can be less than two inches (e.g., between 1.5 and 1.7 inches).

As shown in FIG. 7A, gap 712 can exist between strip carriers 704 and 706, and gap 714 can exist between strip carriers 706 and 708. Inserting a gap between adjacent strip carriers can be important, because the strip carriers can expand under high temperature. Note that, although the thermal expansion coefficient of PBI plastic is very low, it can still be higher than that of the stainless steel base. Hence, to prevent bowing, it can be desirable to allow the strip carriers to expand. In the design shown in FIG. 7A, instead of having a continuous strip carrier carry multiple strips, separate strip carriers with gaps in between are used to carry the multiple strips. The width of the gap can be between 2 and 10 mm, preferably between 5 and 8 mm.

Figure 7C:
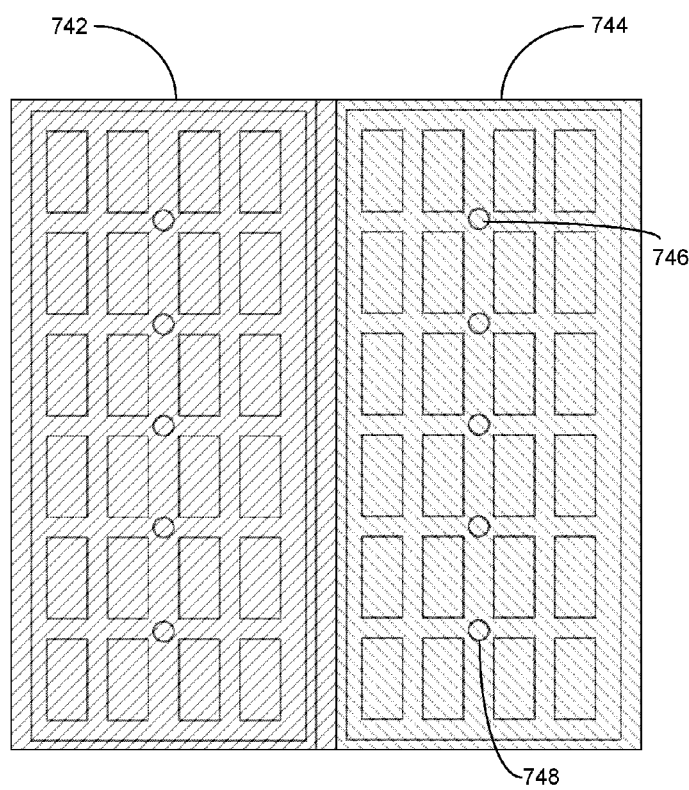
FIG. 7C shows an exemplary placement of two adjacent strips on the strip carriers, according to an embodiment of the present invention.

The way the strips are placed on wafer carrier 700 can also play an important role in the curing process. FIG. 7C shows an exemplary placement of two adjacent strips on the strip carriers, according to an embodiment of the present invention. Strips 742 and 744, shown in different hatch patterns, are placed adjacent to each other. For illustration purposes, in FIG. 7C, strips 742 and 744 are shown as transparent to reveal the strip carriers beneath. To maintain the position of the strips, each strip carrier can include a number of vacuum-holding holes, such as holes 746 and 748.

In the example shown in FIG. 7C, the right edge of strip 742 overlaps with the left edge of strip 744. This can result in the overlapping of the corresponding busbars (not shown in the drawing) of strips 742 and 744. In some embodiments, strips 742 and 744 can be placed in such a way that their overlapping edges (the crosshatched region shown in FIG. 7C) are positioned above the gap between the two adjacent strip carriers. In other words, the edges are not supported by the strip carriers directly. Compared with other arrangements, such as having the overlapping edges on top of a strip carrier, this arrangement can be beneficial to the curing of the conductive paste. Both strips are pulled down against the strip carrier by means of vacuum. In the overlapped region, the edge that is on the bottom will deflect slightly downwards, while the edge that is on the top will deflect slightly upwards, because they are trying to occupy the same space. This allows both edges to be locally parallel to each other, forming the best geometry for bonding. If the overlapped region were directly supported by the strip carrier, the bottom edge would be flat, while only the top edge would deflect upwards. The two edges would no longer be parallel but form an angle, which is not the ideal bonding geometry. The conductive paste typically can cure better when it is heated under pressure.

Figure 8A:
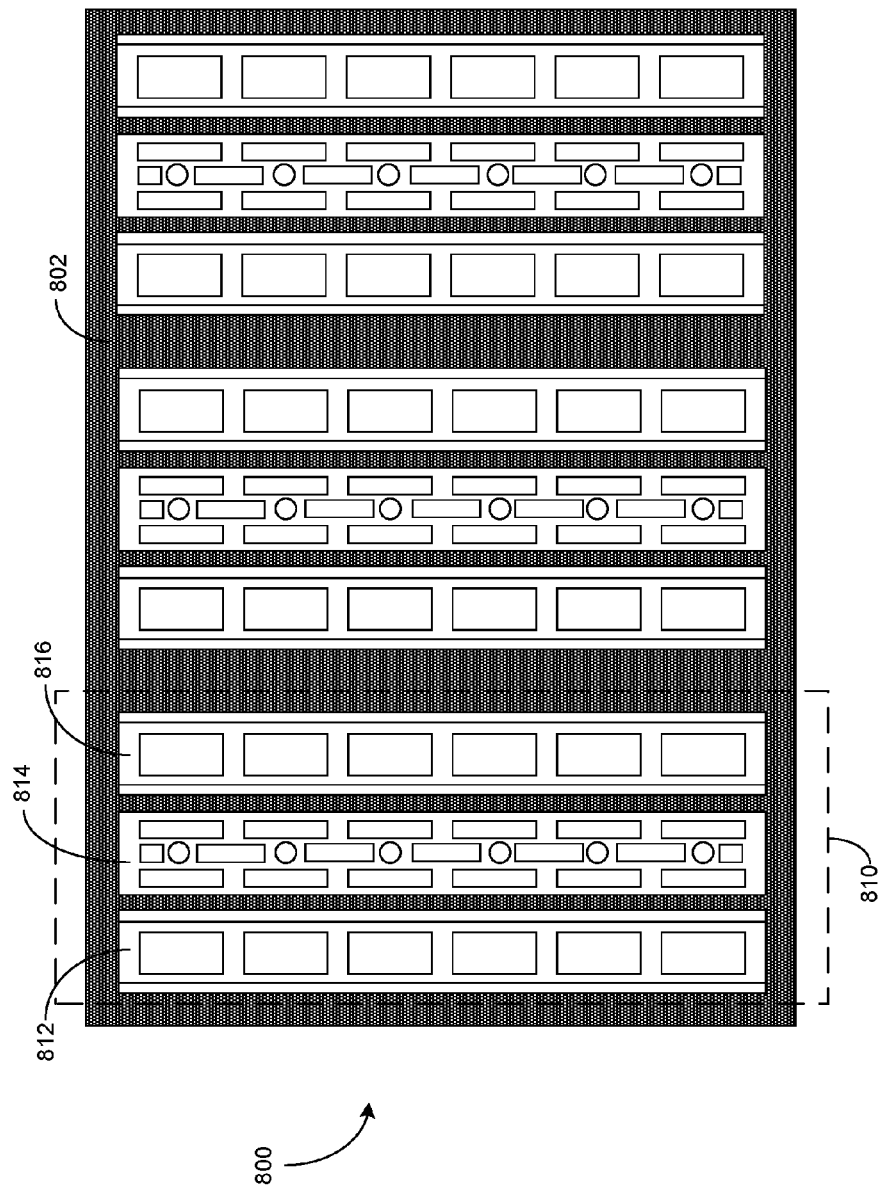
FIG. 8A shows the top view of an exemplary wafer carrier, according to an embodiment of the present invention.

In addition to the example shown in FIG. 7A, the wafer carrier can have other forms. FIG. 8A shows the top view of an exemplary wafer carrier, according to an embodiment of the present invention. Wafer carrier 800 can include a base 802 and a number of strip carriers, each of which can be designed to carry a single strip. Unlike the strip carriers shown in FIG. 7A, in FIG. 8A, each strip carrier can include multiple separate plastic pieces. For example, strip carrier 810 can include plastic pieces 812, 814, and 816. Using smaller pieces of plastic to construct the strip carrier can reduce material cost. More specifically, this can allow different plastic materials to be used to form a strip carrier. In the example shown in FIG. 8A, the center piece of a strip carrier can be made of PBI plastic, whereas the two side pieces can be made of a different plastic material, which can have less ideal thermal properties but can cost less than the PBI. Similar to what's shown in FIG. 7A, the rectangles in each plastic piece indicate indentations, and the circles indicate vacuum-holding holes. To match the conductivity of the side pieces to that of the center piece, one can pattern the side pieces in such a way that a smaller portion of a side piece is in direct contact with the back surface of the strip.

Figure 8B:
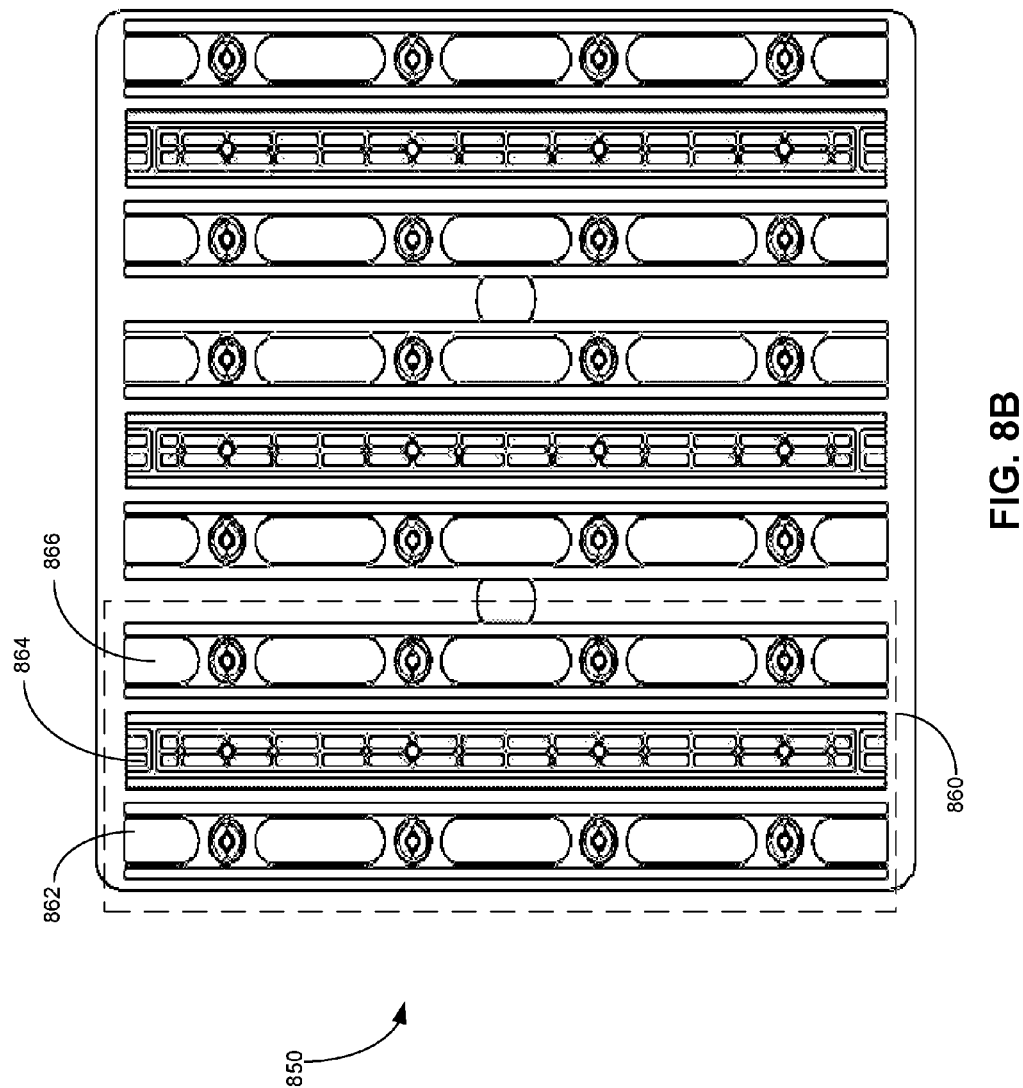
FIG. 8B shows the top view of an exemplary wafer carrier, according to an embodiment of the present invention.

FIG. 8B shows the top view of an exemplary wafer carrier, according to an embodiment of the present invention. Wafer carrier 850 can be similar to wafer carrier 800, and can include three strip carriers, with each strip carrier including three separate plastic pieces. For example, strip carrier 860 can include side pieces 862 and 866 and center PBI piece 864. Center piece 864 can include the vacuum-holding holes for holding down the strip. In the example shown in FIG. 8B, each plastic piece of a strip carrier can be around six inches long and about 0.5 inch wide. The gap between the plastic pieces within the same strip carrier can be about 0.1 inch.

Returning to FIG. 5, in this example, the thermal curing system includes one heater and one wafer carrier, both of which can remain stationary during the curing process. The distance between the radiation surface of the heater and the strips on the wafer carrier can be kept between 2 and 20 mm. Bringing the radiation surface closer to the strips can increase the heating efficiency and shorten curing time. However, if the radiation surface is too close to the strip surface, the high temperature may damage the photovoltaic structure. In addition, a very short heating time may cause the conductive paste to be heated unevenly. In some embodiments, the temperature of the heater can be maintained at around 300° C., the distance between the radiation surface and the strip surface can be about 5 mm, and the wafer carrier can be made of PBI plastic. In such scenarios, the conductive paste can be cured in about 60 seconds. In other words, the overlapping strips can be bonded after being placed under the heater for about 60 seconds. If the strips are removed before the required time for curing, the paste may not be sufficiently cured, which can resulting in poor bonding quality. On the other hand, keeping the strips under the heater longer can reduce the overall system throughput and can potentially damage the strips. In some embodiments, the edge-overlapped strips can be heated for a duration between 10 and 100 seconds, depending on the temperature and thermal design of the heater, as well as the thermal design of the wafer carrier. A well-designed system that can efficiently heat the strips without damaging the photovoltaic junctions can reduce the time needed for curing the conductive paste to a period between 25 and 60 seconds.

Figure 9A:
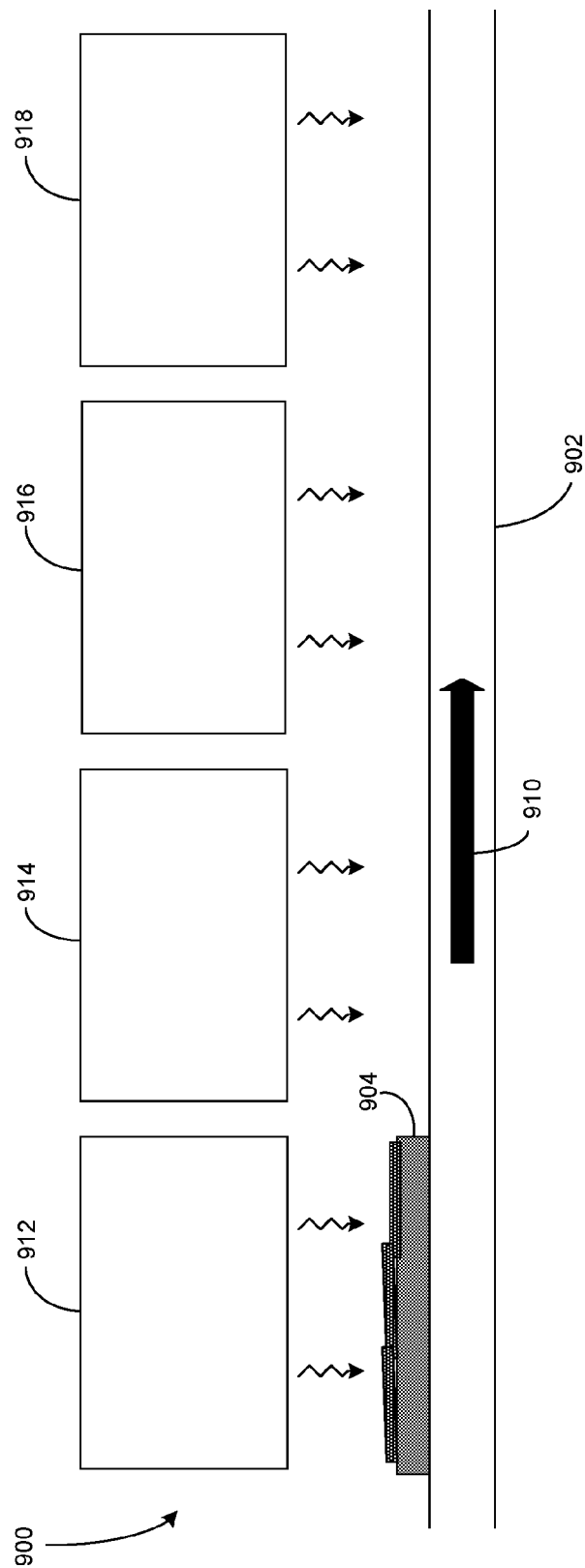
FIG. 9A shows an exemplary inline thermal curing system, according to an embodiment of the present invention.

For large scale manufacturing, to increase throughput, an inline thermal curing system can be used. In an inline curing system, the wafer carrier along with the strips can be placed on a conveyor system and move under multiple heaters. FIG. 9A shows an exemplary inline thermal curing system, according to an embodiment of the present invention. Inline thermal curing system 900 can include conveyor system 902, which carries wafer carrier 904, and a number of heaters, such as heaters 912, 914, 916, and 918. A number of photovoltaic strips can be held on the surface of wafer carrier 904 by a vacuum-holding mechanism. The surface of wafer carrier 904 can be made of PBI plastic, which is a good heat insulator. The strips have been aligned to each other such that their corresponding edge busbars overlap. Sandwiched between the overlapping busbars is the to-be-cured conductive paste.

During operation, conveyor system 902 can first move wafer carrier 904 under heater 912 and then remain stationary to allow wafer carrier 904 to stay under heater 912 for a predetermined time. For example, wafer carrier 904 can stay under heater 912 for about 15 seconds. Subsequently, conveyor system 902 can move in a direction indicated by arrow 910 and move wafer carrier to a position under heater 914. Once wafer carrier 904 is in position, conveyor system 902 can stop again for a predetermined time. The same process can repeat until conveyor system 902 moves wafer carrier 904 to a position under last heater 918 and remains there for a predetermined time period. Subsequently, the bonded strips can be removed from wafer carrier 904 and carried by conveyor system 902 to a next processing station. Wafer carrier 904 can be brought back to starting point of inline thermal curing system 900 to carry a new set of strips. In some embodiments, conveyor system 902 can be configured in such a way that wafer carrier 904 can stay under each heater for an equal amount of time. The total heating time of the strips, for the example shown in FIG. 9A, can then be four times the time the strips spent under each individual heater. By carefully programming conveyor system 902, one can ensure that the total heating time of the strips can be sufficient to cure the conductive paste. For example, if the strips spend about 15 seconds under each heater, the total heating time can be roughly 60 seconds, which can be sufficient to cure the conductive paste, given that each heater is kept at about 300° C.

In some embodiments, the heaters (e.g., heaters 912-918) can be configured to have different temperatures. More specifically, the temperature of the front (left side in FIG. 9A) heater (e.g., heater 912) can be lower than that of the ones at the back (e.g., heaters 916 and 918). The temperature can rise sequentially from the front heaters to the back heaters. For example, heater 914 can have a higher temperature than heater 912, heater 916 can have a higher temperature than heater 914, and heater 918 can have a higher temperature than heater 916. This way, when strips on wafer carrier 904 are moving along with conveyor system 902, they can pass through heating zones with increasing temperatures, thus preventing the strips from suffering thermal shock.

The implementation of conveyor system 902 can make it possible for parallel curing of multiple groups of strips. More specifically, when wafer carrier 904 is moved from heater 912 to heater 914, a different wafer carrier carrying a different group of strips can be positioned under heater 912, and both groups of strips can be then heated simultaneously. This process can repeat with conveyor system 902 simultaneously moving multiple groups of strips under the multiple heaters, increasing the system throughput fourfold.

FIG. 9B shows an exemplary inline thermal curing system, according to an embodiment of the present invention. In FIG. 9B, inline thermal curing system 920 can include conveyor system 922, which carries wafer carrier 924, and extended heater 926. Extended heater 926 can be much larger in size than individual heaters 912-918 shown in FIG. 9A, thus allowing many more strips to be heated simultaneously. The bottom surface of heater 926, which can be the radiation surface of heater 926, can include a number of divided sections (e.g., section 928). Alternatively, extended heater 926 can include multiple sections (e.g., radiation blocks) placed inside a same physical enclosure. These multiple sections can also be configured to have different temperatures to allow photovoltaic strips to go through heating zones with increasing temperature when moving along conveyor system 922 in the direction shown by arrow 930.

During fabrication, wafer carrier 924 can start from a location outside of the area below extended heater 926. In the example shown in FIG. 9B, wafer carrier 924 can start from a location to the left of extended heater 926. A robotic arm (not shown in FIG. 9B) can pick up a set of photovoltaic strips and place the strips on wafer carrier 924. The strips can be arranged in such a way that adjacent strips overlap at the edge. In some embodiments, the robotic arm can pick up and arrange three strips each time. Once a set of strips is placed on wafer carrier 924, conveyor system 922 can move wafer carrier 924 to place the front portion of wafer carrier 924 under extended heater 926, as shown in FIG. 9B. In some embodiments, conveyor system 922 can continue to move until the last overlapping edge of the set of strips is under extended heater 926, as indicated by dashed line 932. Conveyor system 922 can then pause for a predetermined time (e.g., between 10 and 15 seconds) to allow the set of strips and, thus, conductive paste sandwiched between the overlapping edges to be heated by extended heater 926.

While conveyor system 922 remains stationary, the robotic arm can lay another set of strips (e.g., strip set 934) onto wafer carrier 924. The new set of strips can be arranged to be edge-overlapped with the set of strips that was already on wafer carrier 924 to form a longer string. After conveyor system 922 has remained stationary for the predetermined time, conveyor system 922 can move forward again to place the newly laid set of strips under extended heater 926 for heating. This process can repeat itself until a desired number of strips has been laid onto wafer carrier 924 and has moved through extended heater 926. The total amount of time that a set of strips remains under extended heater 926 (i.e., the total amount of heating time) can be determined based on the temperature setting of extended heater 926. For example, if the temperature of extended heater 926 is set to be at around 300° C., the total amount of time used to move a set of strips from one end of extended heater 926 to the other end of extended heater 926 can be roughly 60 seconds. Considering that conveyor system 922 may pause multiple times during the duration within which a particular set of strips remains under extended heater 926, the time duration for each pause can be determined based on the total heating time and the number of pauses. For example, if it takes conveyor system 922 four pauses in order to move a particular set of strips from one end of extended heater 926 to the other end, each pause may last for about 15 seconds. FIG. 9C shows the end of a wafer carrier moving out of the heated region below the heater, according to an embodiment of the present invention.

Once all strips for a string have been moved out of the heated region under the extended heater, meaning that the conductive paste has been cured to mechanically bond the strips together, the entire string can be removed from the wafer carrier. In some embodiments, a robotic arm can pick up the string and transfer it to the next processing station (e.g., the panel assembly station). Moreover, the extended heater can move up to be further away from the conveyor system in order to reduce the amount of heat radiated onto the conveyor system. This is because the conveyor system is currently not covered by the wafer carrier having a heat-insulating surface. Moving the extended heater further away from the conveyor system can also make it easier for loading and unloading of a wafer carrier. In some embodiments, after the removal of the string, the conveyor system can reverse its direction to move the empty wafer carrier back to the other end of the extended heater to allow new strips to be loaded onto the wafer carrier and moved into the heated zones. In alternative embodiments, the conveyor system can continue to move in the same direction with another wafer carrier being placed onto the beginning end of the extended heater.

Figure 9D:
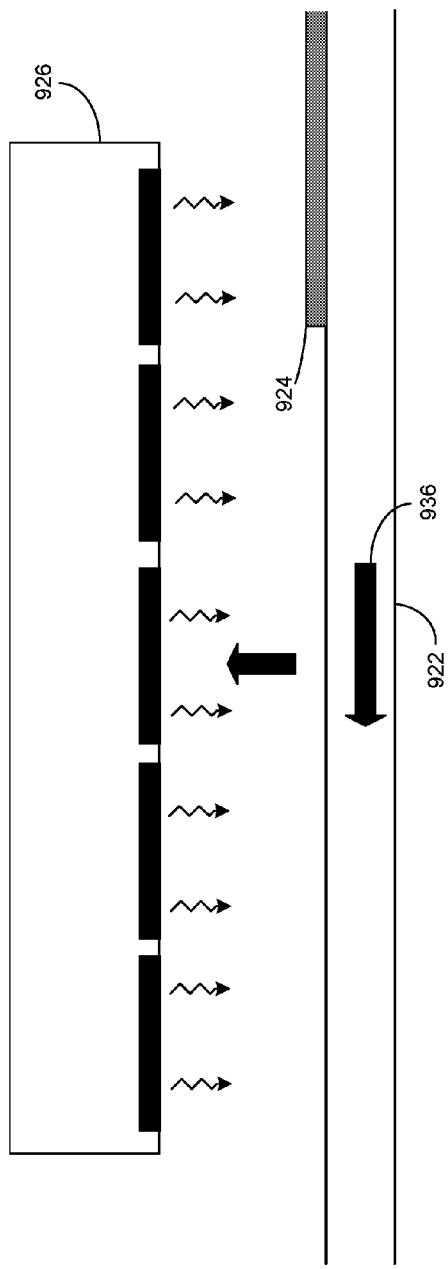
FIG. 9D shows the movement of the empty wafer carrier, according to an embodiment of the present invention.

FIG. 9D shows the movement of the empty wafer carrier, according to an embodiment of the present invention. After the photovoltaic string has been removed from wafer carrier 924, conveyor system 922 reverse its moving direction (indicated by arrow 936) to move empty wafer carrier 924 back to the left side of extended heater 926. In addition, extended heater 926 can move up to a predetermined location. In some embodiments, the distance between the radiation surface of extended heater 926 and the top surface of conveyor system 922 can be between 10 and 20 mm. On the return trip, wafer carrier 924 does not need to pause.

Wafer carrier 924 can be much larger than wafer carrier 904 and can carry a relatively large number of photovoltaic strips. In some embodiments, wafer carrier 924 can be configured to carry an entire string of photovoltaic structures for a solar panel. For example, wafer carrier 924 can hold between 15 and 40 strips. The surface of wafer carrier 924 can be covered by multiple segments of PBI (which can be similar to PBI segments 814 and 864, shown in FIGS. 8A and 8B, respectively) to ensure that the carried strips are thermally insulated from the base of wafer carrier 924. FIG.

9E shows a top view of the wafer carrier, according to an embodiment of the present invention. The surface of wafer carrier 940 can be covered with a number of PBI segments, such as PBI segments 942 and 946. An air gap can exist between adjacent PBI segments to allow individual PBI segments to expand when heated, thus preventing wafer carrier 940 from surface warping.

Figure 9E:
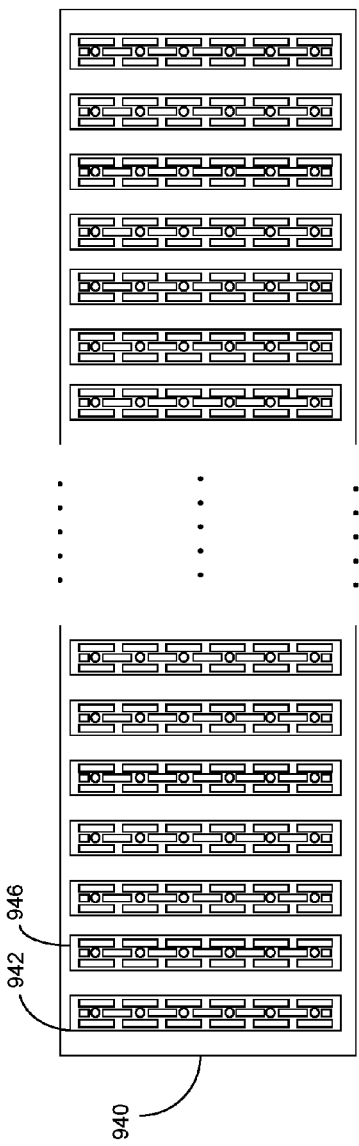
FIG. 9E shows a top view of the wafer carrier, according to an embodiment of the present invention.
Figure 9F:
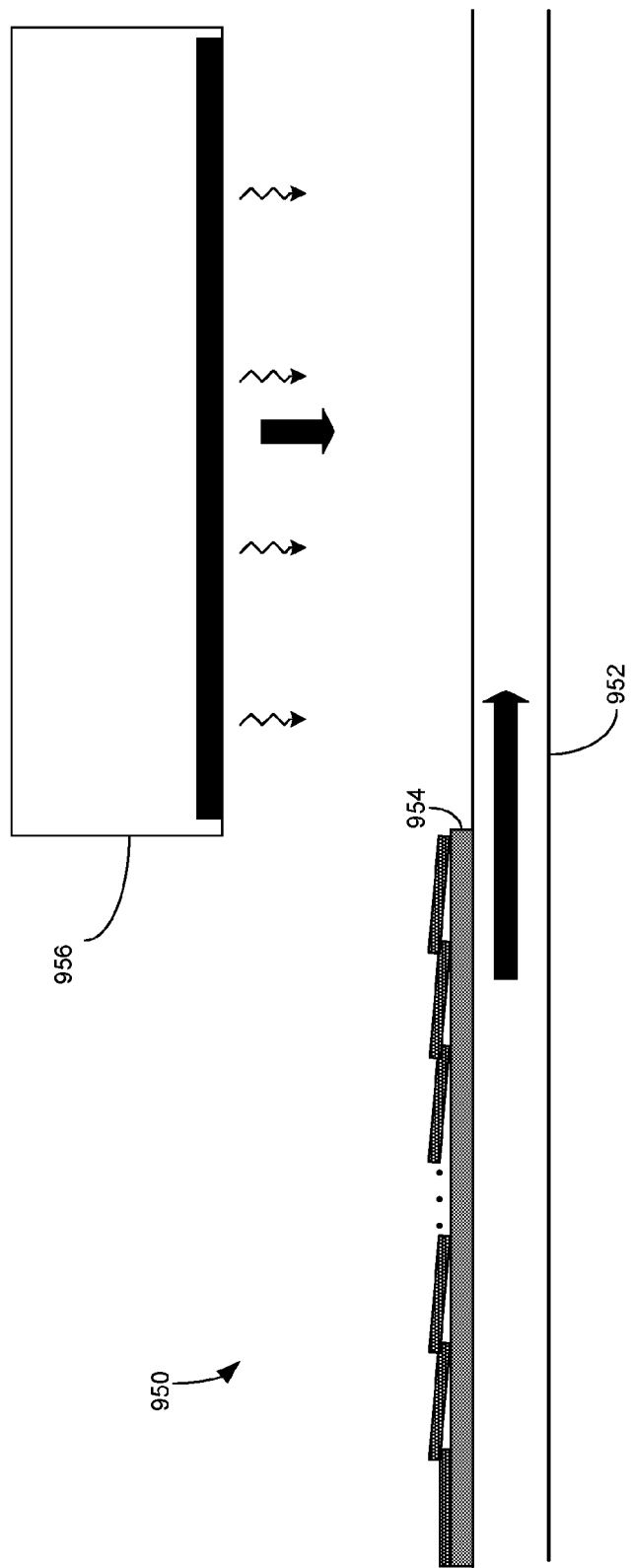
FIG. 9F shows an exemplary inline thermal curing system, according to an embodiment of the present invention.

In the examples shown in FIGS. 9A-9D, the conveyor system operates in a stop-and-go fashion, which can be less ideal because a stop-and-go conveyor may be prone to mechanical failure. To overcome this problem, in some embodiments, the conveyor system can be configured to move continuously. FIG. 9F shows an exemplary inline thermal curing system, according to an embodiment of the present invention. Inline thermal curing system 950 can include conveyor system 952, which carries wafer carrier 954, and single continuous heater 956. Heater 956 can extend along the length of conveyor system 952. Wafer carrier 954 can include an insulation surface that can be made of PBI plastic segments, similar to wafer carrier 940 shown in FIG. 9E. The insulation surface can be in direct contact with photovoltaic strips carried by wafer carrier 954.

During operation, a number of strips that make an entire string can be laid onto wafer carrier 954 before wafer carrier 954 is sent to the heated region under heater 956. For example, if a string includes 21 strips, all 21 strips will be laid in an edge-overlapping fashion onto the surface of wafer carrier 954. Heater 956 can be maintained at an initial position that is relatively far away (e.g., between 10 and 20 cm) from the surface of conveyor system 952. Subsequent to all the strips having been loaded onto wafer carrier 954, heater 956 can move down to be close to the surface of conveyor system 952, and conveyor system 952 can start to move wafer carrier 954 to the right to be below heater 956. In some embodiments, when wafer carrier 954 is at least partially below heater 956, the distance between the radiation surface of heater 956 and the photovoltaic strips carrier on wafer carrier 954 can be between 2 and 10 mm, preferably between 2 and 5 mm. The relatively small distance ensures good heating efficiency. Because heater 956 extends along the direction in which conveyor system 952 moves, photovoltaic strips carried by wafer carrier 924 can be heated by heater 956 while moving along with conveyor system 952. The length of heater 956 and the moving speed of conveyor system 952 can determine the total amount of time a strip spends underneath heater 956. As discussed previously, the amount of time a strip spends underneath heater 956 should be sufficiently long to ensure that conductive paste applied on the strip can be cured. In some embodiments, it may take a strip about 60 seconds to travel from one end of heater 956 to the other end.

In the example shown in FIG. 9A, the size of each heater can be comparable to the size of the wafer carrier. Hence, in FIG. 9A, the thermal curing system may be used to bond, each time, a group of strips fitted onto a single wafer carrier to form shorter strings. For example, each short string may have three strips. The shorter strings can later be bonded to each other to form a longer string. On the other hand, in the examples shown in FIGS. 9B-9F, the heater and the wafer carrier can be much longer. More specifically, the wafer carrier can be long enough to carry a larger number of strips, which can be bonded simultaneously to form a longer string. For example, the longer string can have between 15 and 40 strips. Being able to form longer strings directly from individual strips can increase the system throughput.

Figure 10:
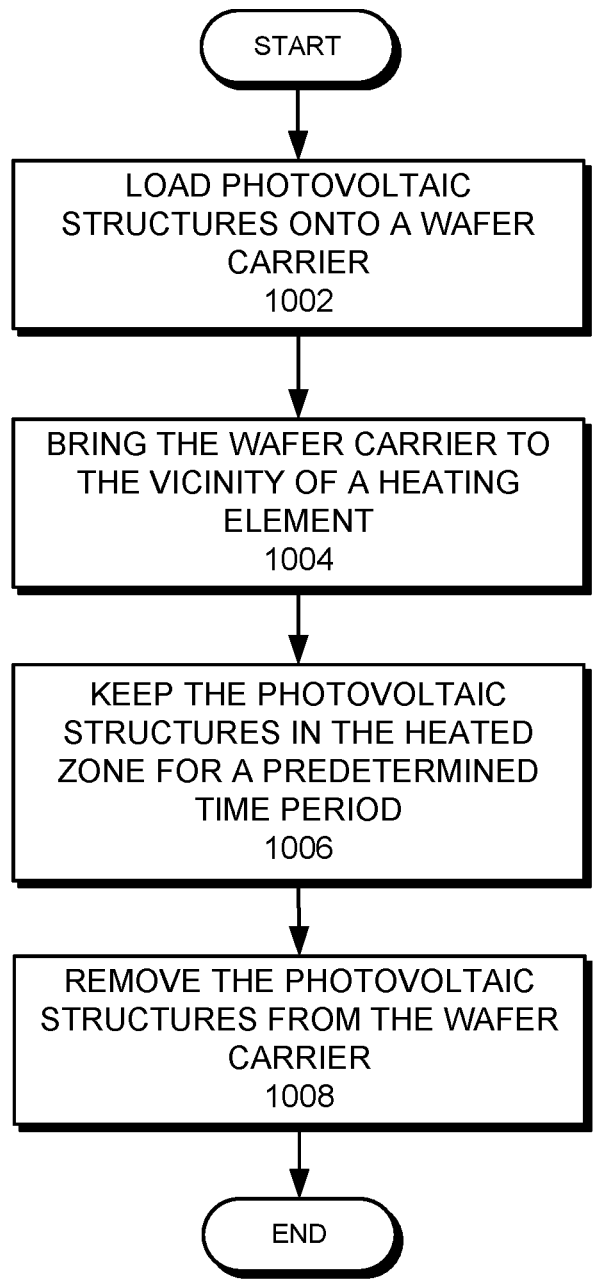
FIG. 10 shows an exemplary process for curing conductive paste applied onto photovoltaic structures, in accordance with an embodiment of the present invention.

FIG. 10 shows an exemplary process for curing conductive paste applied onto photovoltaic structures, in accordance with an embodiment of the present invention. During operation, photovoltaic structures applied with conductive paste can be loaded onto a wafer carrier (operation 1002). The wafer carrier can include a surface that is in direct contact with the photovoltaic structures, and such a surface can be made with thermally insulating and heat-resistant materials. In some embodiments, the surface of the wafer carrier can be made of PBI plastic.

Subsequently, the wafer carrier along with the photovoltaic structures can be brought to the vicinity of a heater (operation 1004). The heater can include a radiation surface that can efficiently radiate heat in a particular direction. In some embodiments, the radiation surface can be configured to radiate heat in a downward direction, and the wafer carrier can be brought to a location underneath the radiation surface. In further embodiments, the distance between the radiation surface and the wafer carrier can be between 2 and 10 mm to allow efficient heating. The wafer carrier and the photovoltaic structures can remain in the heated zone under the radiation surface for a predetermined time period to ensure proper curing of the conductive paste (operation 1006). The photovoltaic structure can remain stationary or move along a conveyor system while being heated. After the conductive paste is cured, the photovoltaic structures can be removed from the wafer carrier (operation 1008).

Figure 11:
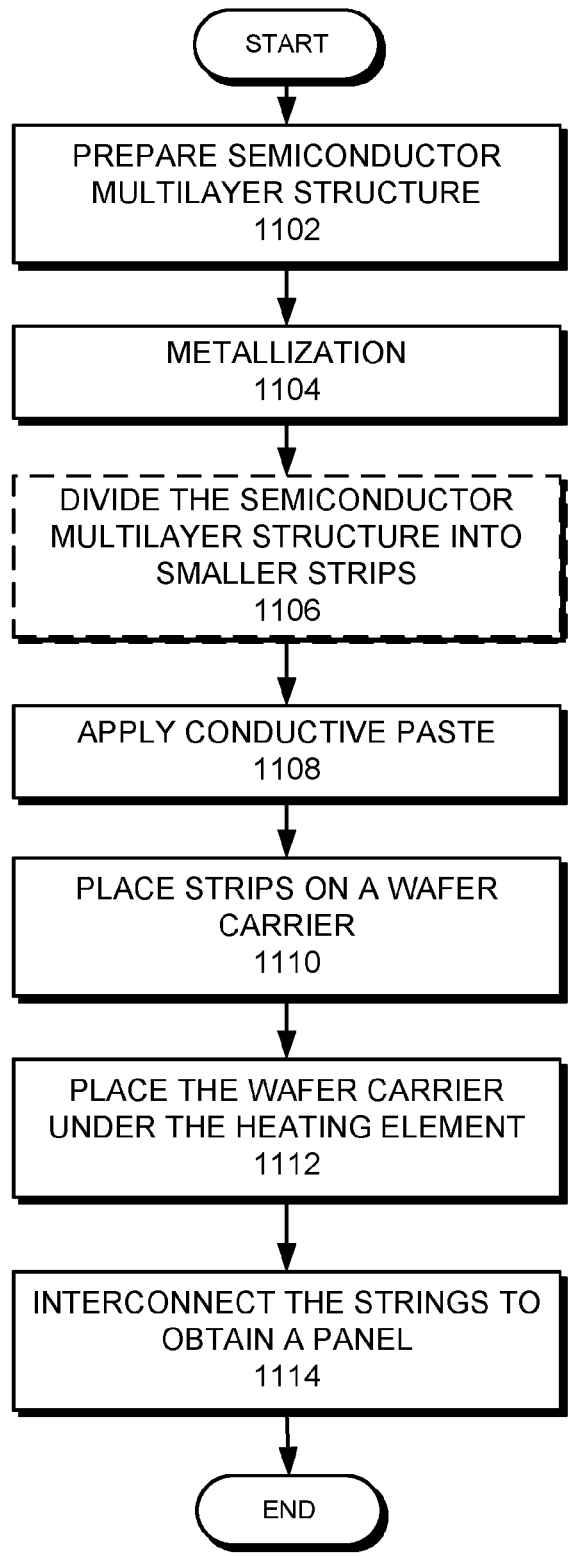
FIG. 11 shows an exemplary process for forming a solar panel, according to an embodiment.

FIG. 11 shows an exemplary process for forming a solar panel, according to an embodiment. During fabrication, a semiconductor multilayer structure can be prepared (operation 1102). The semiconductor multilayer structure can include the base, the emitter, the surface field layer, and one or more transparent conductive oxide (TCO) layers. The semiconductor multilayer can also optionally include quantum tunneling barrier (QTB) layers on one or both sides of the base layer. The semiconductor multilayer structure can then go through a metallization process, which can form a metallic grid on both surfaces of the semiconductor multilayer structure (operation 1104). Different metallization techniques can be used to form the metallic grids. For example, an electroplating process that uses a wax-based plating mask can be used to form the metallic grids.

Subsequently, the photovoltaic structure can optionally be divided into smaller strips (operation 1106), and conductive paste can be applied on an edge busbar of each strip or photovoltaic structure (operation 1108). A number of strips can be placed onto a specially designed wafer carrier having a heat insulation surface, with adjacent strips overlapping at the edges (operation 1110). As a result, the edge busbars of the adjacent strips overlap and the conductive paste is sandwiched between the overlapping busbars.

The specially designed wafer carrier can then be placed under a heater that radiates heat for a predetermine time to cure the conductive paste (operation 1112). Note that the wafer carrier may remain stationary or may move along a conveyor system during the conductive-paste-curing process. In some embodiments, the heater can include a radiation block having a temperature of about 300° C., and the wafer carrier can be placed under the radiation block for at least 60 seconds. The curing of the conductive paste can result in the formation of strings. Finally, the strings can be interconnected to form a panel (operation 1114).

In general, embodiments of the present invention can provide a novel conductive-paste-curing system. The novel system relies on radiation for heat transfer, which can provide better heating uniformity. The efficiency of the system can be improved by the novel design of the radiation block and a wafer carrier with an insulation surface. The throughput of the system can be improved by implementing a conveyor system for inline operation.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for curing conductive paste applied to two adjacent photovoltaic structures, the method comprising:
    placing the two adjacent photovoltaic structures on a wafer carrier, wherein the two photovoltaic structures are coupled in a cascaded manner by a conductive paste, where two adjacent edges of the two photovoltaic structures overlap, wherein the wafer carrier includes a surface element that is in direct contact with the photovoltaic structures and is substantially thermally insulating, and wherein the wafer carrier is placed on a conveyor; and
    controlling movement of the conveyor to position the wafer carrier to a vicinity of a heating block such that a heated radiation surface of the heating block radiates heat to the photovoltaic structures for a predetermined duration to cure the conductive paste.

2. The method of claim 1, wherein the surface element of the wafer carrier is made of polybenzimidazole (PBI) plastic.

3. The method of claim 1, wherein the surface element includes a number of components separated by air gaps to allow an individual component to expand when heated.

4. The method of claim 1, wherein the heated radiation surface is maintained at a predetermined temperature between 200 and 600° C., and wherein the predetermined duration is between 25 and 60 seconds.

5. The method of claim 1, wherein the heated radiation surface of the heating block is coated with a substantially dark colored coating.

6. The method of claim 5, wherein the substantially dark colored coating includes an anodizing coating or a high-emissivity coating, and wherein a thickness of the dark colored coating is between 1 and 100 microns.

7. The method of claim 5, wherein other surfaces of the heating block are polished or covered with a layer of thermal insulation material.

8. The method of claim 1, wherein the heating block is made of a material having a thermal conductivity of at least 50 W/(m·k).

* * * * *